(12) United States Patent
Reis et al.

(10) Patent No.: US 7,303,005 B2
(45) Date of Patent: Dec. 4, 2007

(54) HEAT SPREADERS WITH VIAS

(75) Inventors: Bradley E. Reis, Westlake, OH (US);
Martin David Smalc, Parma, OH (US);
Brian J. Laser, Munroe Falls, OH
(US); Gary Stephen Kostyak,
Brunswick, OH (US); **Prathib
Skandakumaran**, Cleveland, OH (US);
Matthew G. Getz, Medina, OH (US);
Michael Frastaci, Parma, OH (US)

(73) Assignee: GrafTech International Holdings Inc., Parma, OH (US)

( * ) Notice: Subject to any disclaimer, the term of this patent is extended or adjusted under 35 U.S.C. 154(b) by 151 days.

(21) Appl. No.: 11/339,338

(22) Filed: Jan. 25, 2006

(65) Prior Publication Data

US 2007/0102142 A1 May 10, 2007

Related U.S. Application Data

(63) Continuation-in-part of application No. 11/267,933, filed on Nov. 4, 2005.

(51) Int. Cl.
*F28F 9/02* (2006.01)

(52) U.S. Cl. ............... 165/185; 165/80.2; 29/890.3

(58) Field of Classification Search ............... 165/80.2, 165/185; 361/707–710; 29/890.03
See application file for complete search history.

(56) References Cited

U.S. PATENT DOCUMENTS

| | | | |
|---|---|---|---|
| 3,404,061 A | 10/1968 | Shane et al. ............... 161/125 |
| 3,678,995 A | 7/1972 | Collard ..................... 165/185 |
| 4,234,638 A | 11/1980 | Yamazoe et al. ............ 428/133 |
| 4,782,893 A | 11/1988 | Thomas ..................... 165/185 |
| 4,812,792 A | 3/1989 | Leibowitz .................. 333/238 |
| 4,878,152 A | 10/1989 | Sauzade et al. ............. 361/386 |
| 4,895,713 A | 1/1990 | Greinke et al. ............. 423/448 |
| 4,961,991 A | 10/1990 | Howard ..................... 428/246 |
| 5,192,605 A | 3/1993 | Mercuri et al. ............. 428/224 |
| 5,224,030 A | 6/1993 | Banks et al. ................ 361/386 |
| 5,255,738 A | 10/1993 | Przilas ...................... 165/185 |
| 5,287,248 A | 2/1994 | Montesano ................. 361/708 |
| 5,316,080 A | 5/1994 | Banks et al. ................ 165/185 |
| 5,366,688 A | 11/1994 | Terpstra et al. ............. 419/36 |
| 5,509,993 A | 4/1996 | Hirschvogel ............... 156/326 |
| 5,542,471 A | 8/1996 | Dickinson .................. 165/170 |
| 5,660,917 A * | 8/1997 | Fujimori et al. ............ 165/185 |
| 5,718,566 A * | 2/1998 | Ikeda et al. ................. 417/269 |
| 5,902,762 A | 5/1999 | Mercuri et al. ............. 501/99 |
| 5,944,097 A | 8/1999 | Gungor et al. ............. 165/185 |

(Continued)

OTHER PUBLICATIONS

PCT/US02/39749 Published Jun. 26, 2003, WO 03/051772.

(Continued)

*Primary Examiner*—Teresa J. Walberg
(74) *Attorney, Agent, or Firm*—James R. Cartiglia; Waddey & Patterson, P.C.

(57) ABSTRACT

Constructions for and methods of manufacturing graphite heat spreaders having thermal vias placed therethrough are provided. Thermal vias having one or two flanges are disclosed, as are flush thermal vias. Graphite heat spreaders having surface layers covering the graphite material are provided. Graphite heat spreaders having a layer of cladding for increased structural integrity are provided. Also disclosed are methods of co-forging a graphite heat spreader element with a metal thermal via in place therein.

33 Claims, 10 Drawing Sheets

U.S. PATENT DOCUMENTS

| | | | |
|---|---|---|---|
| 5,958,572 A | 9/1999 | Schmidt et al. | 428/320 |
| 6,027,807 A | 2/2000 | Inoue et al. | 428/408 |
| 6,060,166 A | 5/2000 | Hoover et al. | 428/408 |
| 6,075,701 A | 6/2000 | Ali et al. | 361/704 |
| 6,131,651 A | 10/2000 | Richey, III | 165/185 |
| 6,141,216 A | 10/2000 | Holung et al. | 361/687 |
| 6,208,513 B1 | 3/2001 | Fitch et al. | 361/704 |
| 6,503,626 B1 | 1/2003 | Norley et al. | 428/408 |
| 6,538,892 B2 | 3/2003 | Smalc | 361/710 |
| 6,555,223 B2 | 4/2003 | Kubo | 428/408 |
| 6,673,289 B2 | 1/2004 | Reynolds, III et al. | 264/115 |
| 6,706,400 B2 | 3/2004 | Mercuri et al. | 428/408 |
| 6,749,010 B2 | 6/2004 | Getz, Jr. et al. | 165/80.3 |
| 6,758,263 B2 | 7/2004 | Krassowski et al. | 165/185 |
| 6,771,502 B2 | 8/2004 | Getz, Jr. et al. | 361/703 |
| 6,886,249 B2 | 5/2005 | Smalc | 29/890.03 |
| 6,930,885 B2 * | 8/2005 | Barcley | 361/719 |
| 2002/0039749 A1 | 4/2002 | Wu et al. | |
| 2002/0157819 A1 | 10/2002 | Norley et al. | |
| 2003/0019104 A1 | 1/2003 | Smalc | |
| 2003/0116312 A1 * | 6/2003 | Krassowski et al. | 165/185 |

OTHER PUBLICATIONS

European Patent Application No. 95104171.4, Publication No. 0673900, filed Mar. 22, 1995.

Exhibit "A"—webpage for Radian Heatsinks—Standard Heatsink Products.

Exhibit "A"—webpage for Arkua Cooler; Special Design for Intel P4 Socket 423/478; Intel PIII PGA 370; AMD Socket 462.

* cited by examiner

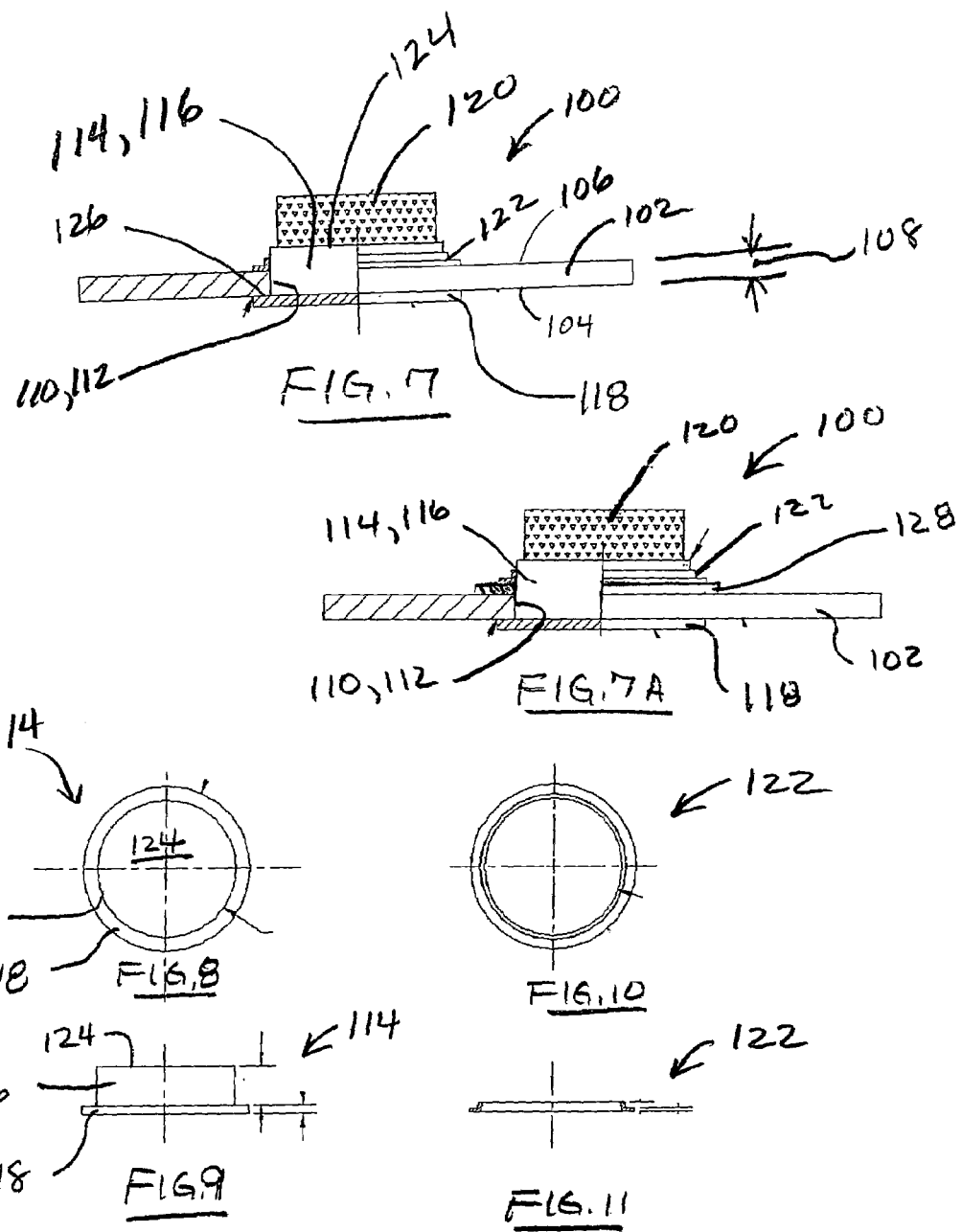

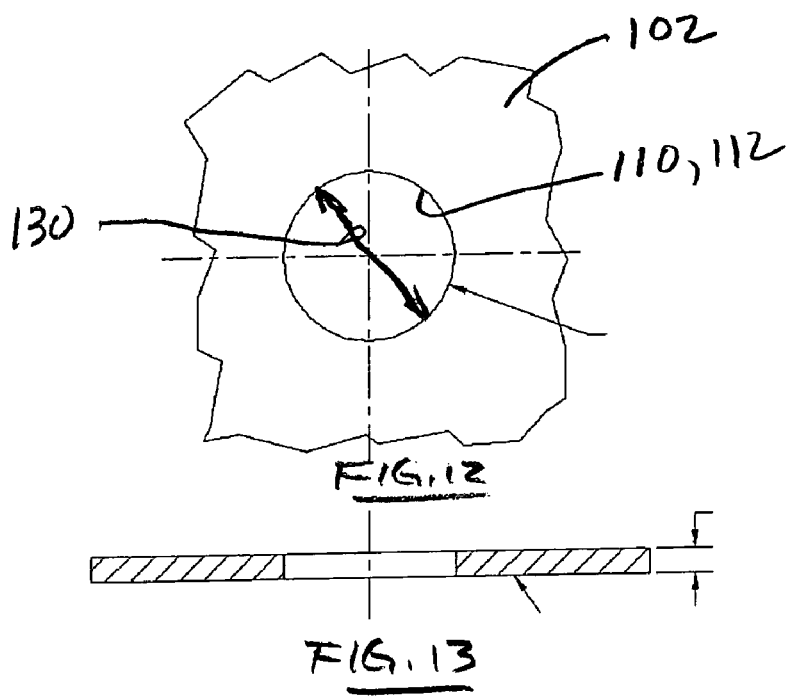
FIG. 12
FIG. 13
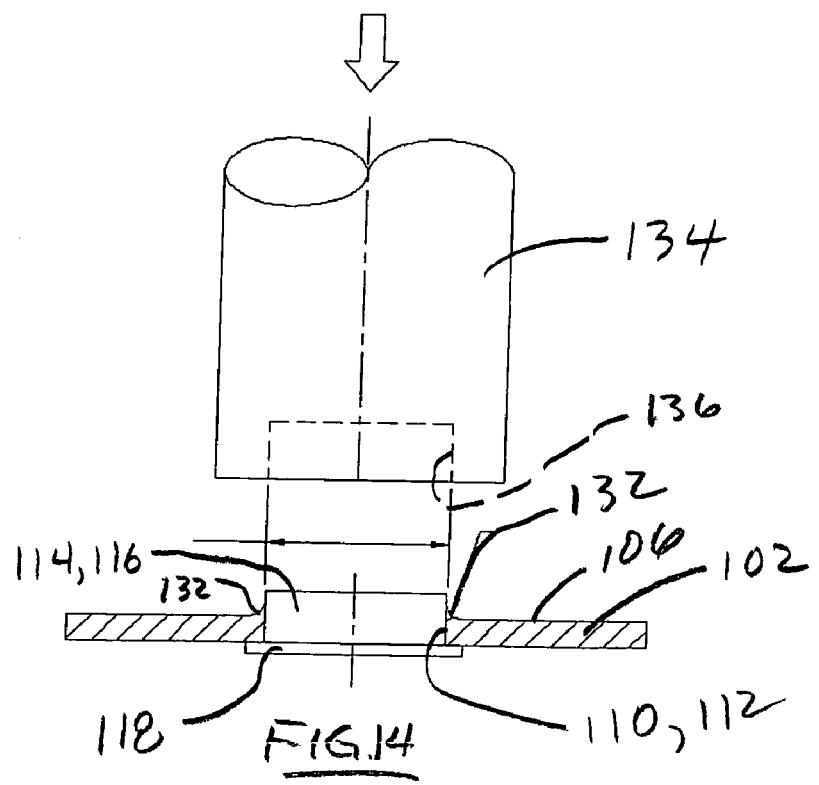
FIG. 14

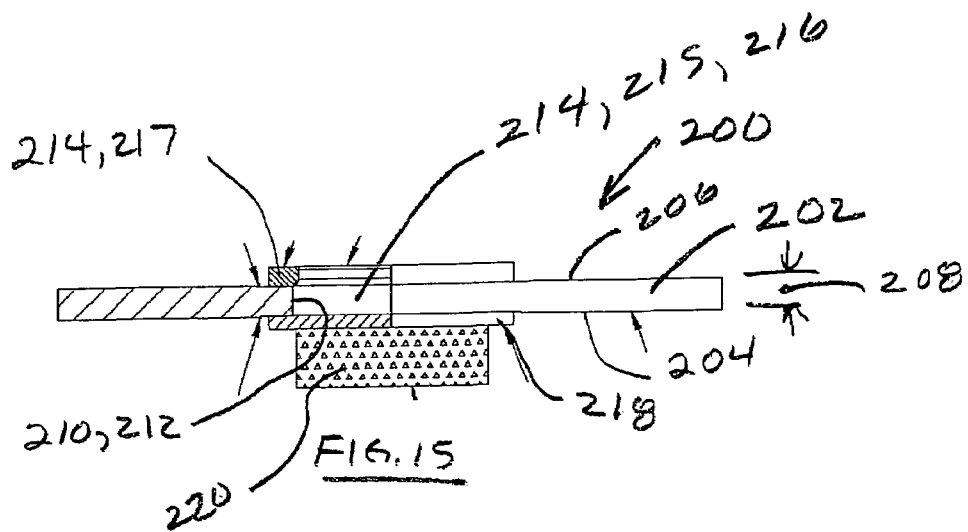
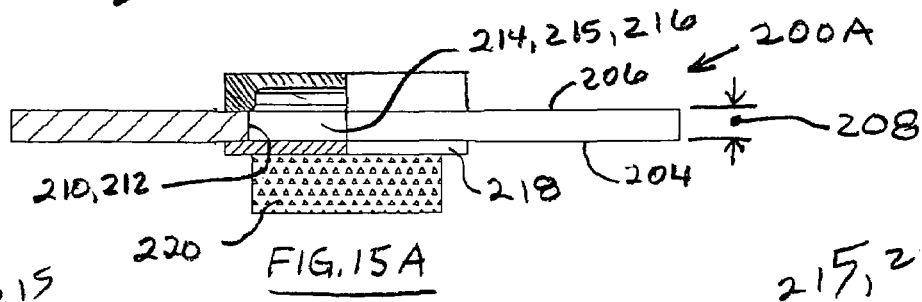
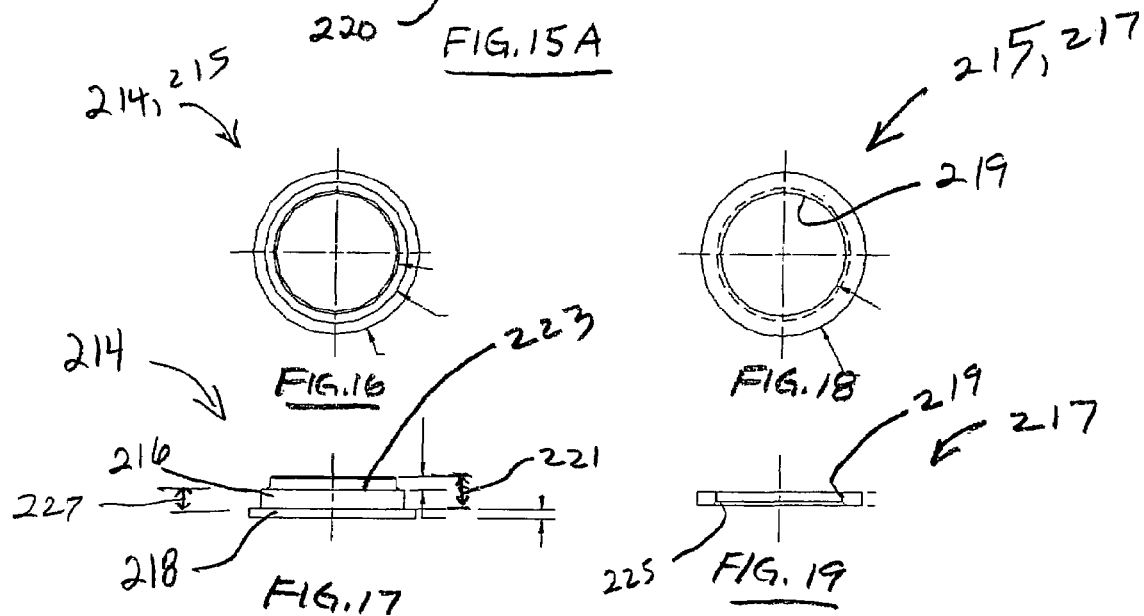

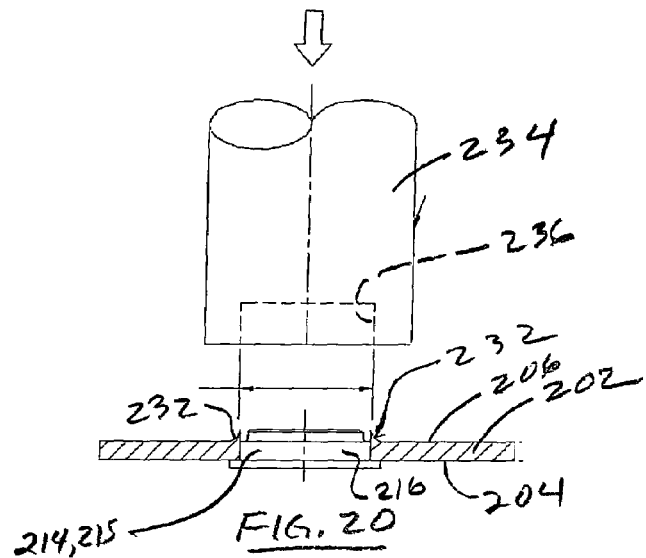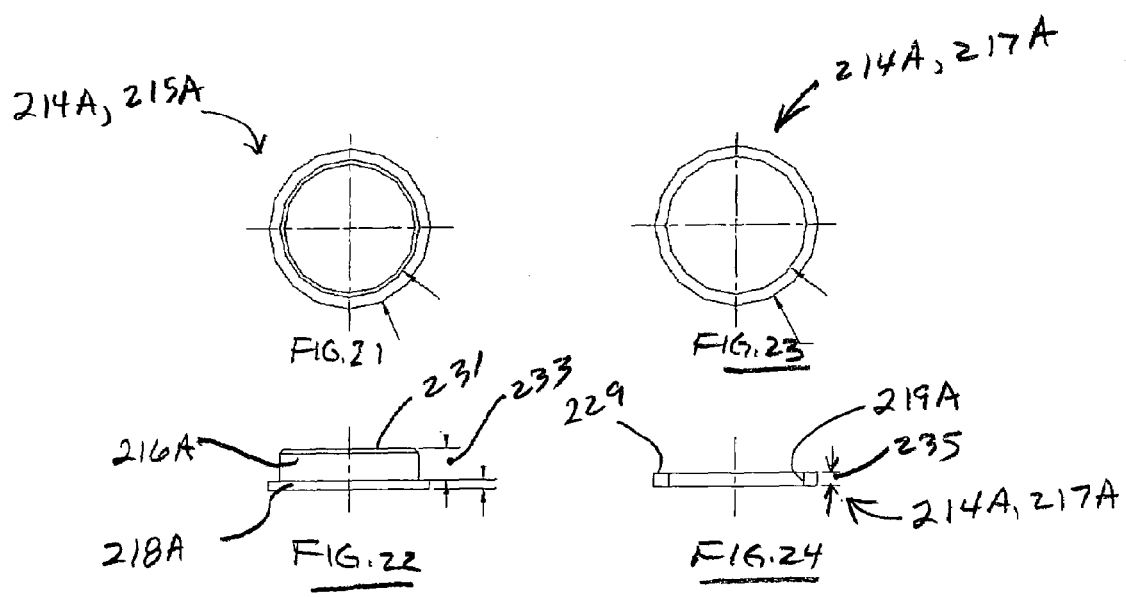

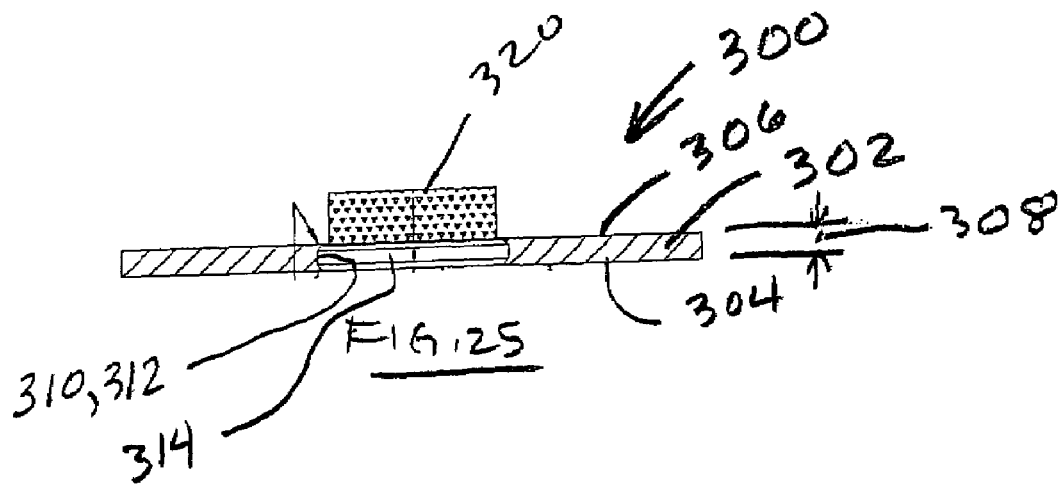
FIG.25
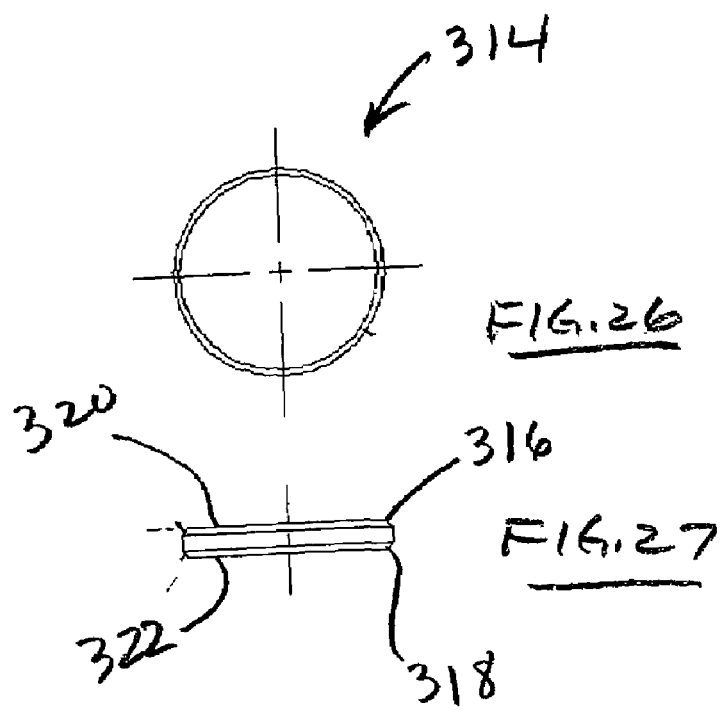
FIG.26
FIG.27

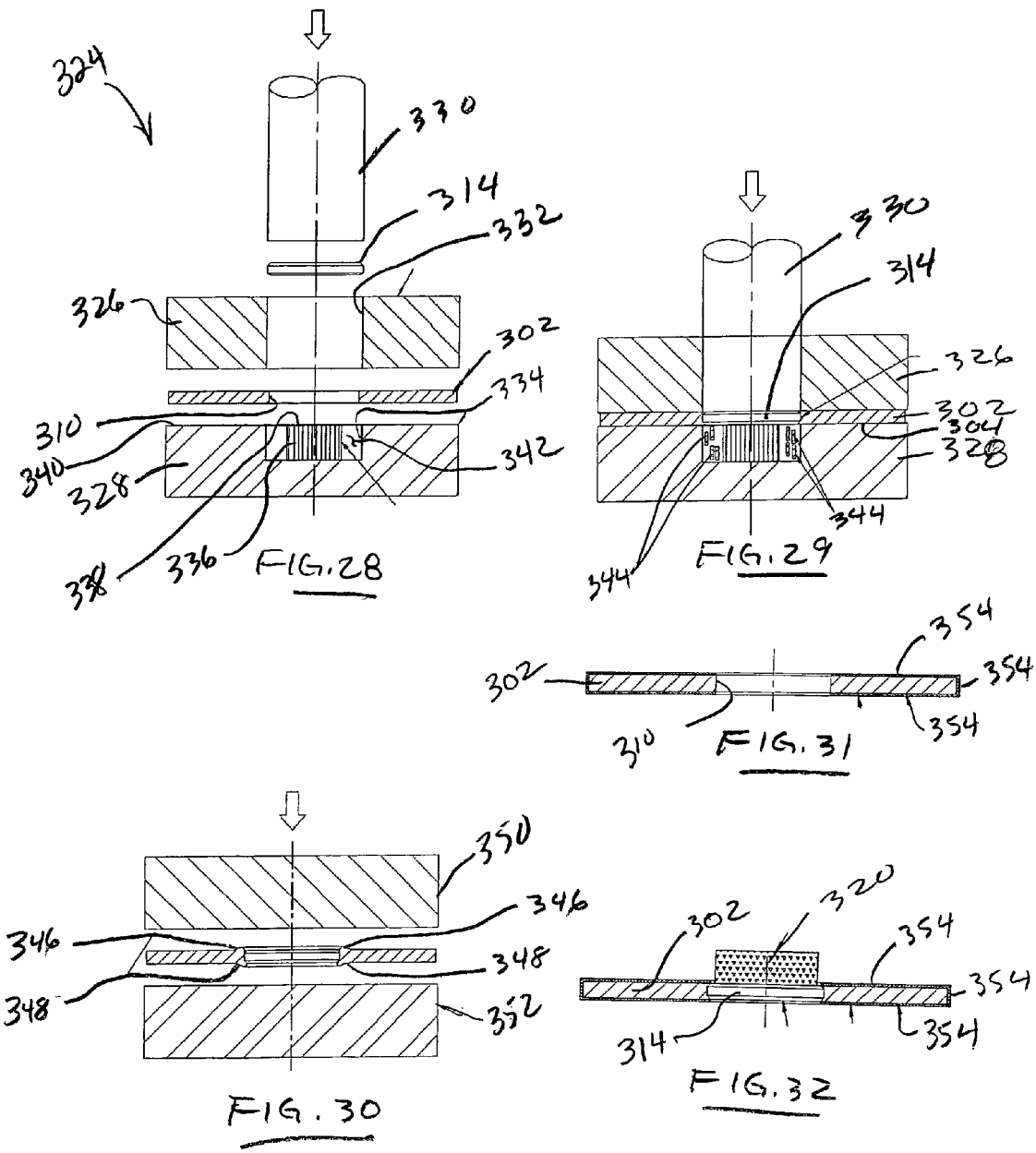

HEAT SPREADERS WITH VIAS

This invention is a continuation-in-part of co-pending U.S. patent application Ser. No. 11/267,933 filed Nov. 4, 2005, entitled "Heat Spreading Circuit Assembly", by Reis et al., the details of which are incorporated herein by reference.

TECHNICAL FIELD

The present invention relates generally to heat spreaders made from anisotropic graphite planar materials, and particularly to such heat spreaders including thermal vias to aid in transmitting heat through the thickness of the heat spreaders.

BACKGROUND OF THE INVENTION

Graphite heat spreaders have previously been proposed to move heat from discrete heat sources. One surface of the spreader is placed against the discrete source and the heat moves from it into the spreader. Heat is then conducted through the spreader and dissipated, from both surfaces of the spreader, to cooler adjacent surfaces by conduction or radiation, or to air by convection. Thick graphite spreaders, with high in-plane thermal conductivity, have a large cross-sectional area to conduct heat and can move more heat than a thin spreader made from the same material. However, graphite materials with a high in-plane thermal conductivity have relatively lower through-thickness thermal conductivity. This low through-thickness thermal conductivity impedes the flow through the thickness of the graphite and does not allow for maximum heat transfer through the spreader.

This problem can be overcome by embedding a thermal via in the graphite spreader at the location of the heat source. The thermal via is made from an isotropic material having a thermal conductivity higher than the through-thickness thermal conductivity of graphite. Candidate via materials include gold, silver, copper, aluminum, etc. and their various alloys. The thermal via is typically round and is sized so that its diameter is large enough to cover approximately the entire surface of the heat source. The end of the via contacts the heat source and heat flows into the via and through it. Heat is transferred into the graphite through the outside diameter of the via. The via transfers heat efficiently through the thickness of the graphite and makes the entire thickness of the graphite spreader available for maximum heat transfer. An example of previous teachings with regard to the use of vias in graphite heat spreaders is shown in U.S. Pat. No. 6,758,263 to Krassowski et al. and assigned to the assignee of the present invention, the details of which are incorporated herein by reference.

A thick graphite heat spreader, made from high in-plane thermal conductivity graphite and incorporating a thermal via is a more efficient spreader of heat than an equivalent all graphite, all copper or all aluminum heat spreader, and it is generally lighter than either an all copper or all aluminum heat spreader.

One particular application in which heat spreaders are used is in conjunction with printed circuit boards. Printed circuit boards are conventionally manufactured from dielectric materials such as glass fiber laminates (known as FR4 boards), polytetrafluoroethylene, and like materials. On one of the surfaces of such boards, or between layers of dielectric materials, are circuits, usually formed of copper. The circuits are commonly formed by photolithographic methods, sputtering, screen printing or the like (for circuits disposed between layers, the circuit is applied to the dielectric material before formation of the laminate). In addition, components such as LEDs, processors, or the like can be disposed on the surface of the boards, in contact with the circuits on the surface. Such components can generate substantial amounts of heat that must be dissipated for them to operate reliably and to their intended performance levels.

As a result of these heat generating components, the amount of heat that printed circuit boards must help dissipate can be significant. So called "thermal boards" are being developed where a layer of a heat spreading material such as copper or aluminum and alloys thereof is laminated with the dielectric material, on the surface opposite or in layers opposing that of the circuit and heat-generating components, to act as a heat spreader for the heat generated from the electronic components. It is important that the heat spreader be located such that at least one layer of dielectric material separates the heat spreader from the circuit(s), since the heat spreader materials are typically electrically conductive, and would interfere with the operation of the circuits if they were in contact.

There are several commercially available "thermal boards," sometimes called metal core printed circuit boards (MCPCB), such as Insulated Metal Substrate™ thermal boards from The Bergquist Company, T-Clad™ thermal boards from Thermagon, HITT Plate boards from Denka, and Anotherm™ boards from TT Electronics. These thermal boards utilize thermally conductive dielectric layers, either through filling the dielectric layer with thermally conductive particles as in the case of the first three, or as in the case of the Anotherm solution, through a thin anodization layer on top of the aluminum heat spreader layer. The use of thermally conductive particles can be expensive, however, and the subsequent layer must be thick enough to ensure it is pin-hole free, adding to thermal resistance in the design. Additional limitations of this approach arise from the lack of flexibility to fabricate bent or non-planar circuit structures, and the fact that the dielectric material covers the entire surface of the heat spreader layer. The use of anodization as the dielectric layer attempts to overcome some of these issues, but forces the use of aluminum as its heat spreader layer, since copper cannot be anodized. Since the thermal conductivity of aluminum is significantly less than that of copper, this can be a thermal disadvantage. All of the foregoing approaches, however, can suffer soldering difficulties, since the same heat dissipation properties that are useful during the operation of the printed circuit board and components, inhibit an assembly process that requires point sources of heat for soldering (such as hot bar bonding, for example).

To overcome some, but not all of these issues, traditional printed circuit boards can be married to a separate metal heat spreader layer in a separate process. In this arrangement, the printed circuit board can be designed with thermal vias (typically drilled holes that are plated with copper) to conduct heat better through the unfilled dielectric layer of the printed circuit board, but these may only be used in applications where electrical isolation from component to component is not required.

Moreover, traditional heat spreading materials like copper or aluminum also add significant weight to the board, which is undesirable, and the coefficient of thermal expansion (CTE) of these materials may not closely match that of the glass fiber laminate, leading to physical stress on the printed circuit board with the application of heat and, potentially, delamination or cracking.

Additionally, since the heat spreader layer on these boards is comprised of an isotropic, thin (relative to its length and width) metal material, heat tends to flow through the thickness of the heat spreader readily, and resulting hot-spots can occur in the location directly opposite the heat source.

Another type of circuit assembly, referred to in the industry as a "flex circuit," provides similar heat management problems. Flex circuits are formed by providing a circuit, such as a copper circuit as described above, on the surface of a polymer material, such as a polyimide or polyester, which functions as the dielectric layer. As the name suggests, these circuit materials are flexible and can even be provided as rolls of circuit materials that can later be married to a heat spreader layer like copper or aluminum. While very thin, the dielectric layer in flex circuits still adds appreciably to the thermal resistance in a given design, and suffers from some of the same issues observed in printed circuit boards. The use of thermal vias is still limited to electrically isolating applications as described previously. And as is apparent, the use of rigid metallic layers, such as of copper or aluminum, does not allow one to take advantage of the flexibility of flex circuits, where such a characteristic is important in an end-use application.

The use of a heat spreader formed of sheet(s) of compressed particles of exfoliated graphite can remedy many of the disadvantages encountered with the use of copper or aluminum heat spreaders, since such graphite materials provide the advantage of an 80% weight reduction compared to copper, while being able to match or even exceed the thermal conductivity of copper in the in-plane direction needed for heat spreading across the surface of a printed circuit board. In addition, graphite has an in-plane CTE of essentially zero, and lower stiffness than copper or aluminum, thus reducing thermal stresses at the graphite-dielectric bond.

While sheets of compressed particles of exfoliated graphite can even have the flexibility for use with flex circuits, the addition of a graphite-based heat spreader layer cannot counter all of the disadvantages arising from the location of a heat spreader such that one or more layers of dielectric material separate the heat spreader from the heat-generating components, with the reduced heat transfer from the components to the heat spreader layer.

Laminates in which one or more of the layers consist of flexible graphite sheets are known in the art. These structures find utility, for example, in gasket manufacture. See U.S. Pat. No. 4,961,991 to Howard. Howard discloses various laminate structures which contain metal or plastic sheets, bonded between sheets of flexible graphite. Howard discloses that such structures can be prepared by cold-working a flexible graphite sheet on both sides of a metal net and then press-adhering the graphite to the metal net. Howard also discloses placing a polymer resin coated cloth between two sheets of flexible graphite while heating to a temperature sufficient to soften the polymer resin, thereby bonding the polymer resin coated cloth between the two sheets of flexible graphite to produce a flexible graphite laminate. Similarly, Hirschvogel, U.S. Pat. No. 5,509,993, discloses flexible graphite/metal laminates prepared by a process which involves as a first step applying a surface active agent to one of the surfaces to be bonded. Mercuri, U.S. Pat. No. 5,192,605, also forms laminates from flexible graphite sheets bonded to a core material which may be metal, fiberglass or carbon. Mercuri deposits and then cures a coating of an epoxy resin and particles of a thermoplastic agent on the core material before feeding core material and flexible graphite through calender rolls to form the laminate.

In addition to their utility in gasket materials, graphite laminates also find utility as heat transfer or cooling apparatus. The use of various solid structures as heat transporters is known in the art. For example, Banks, U.S. Pat. Nos. 5,316,080 and 5,224,030 discloses the utility of diamonds and gas-derived graphite fibers, joined with a suitable binder, as heat transfer devices. Such devices are employed to passively conduct heat from a source, such as a semiconductor, to a heat sink.

In U.S. Pat. No. 6,758,263, Krassowski and Chen disclose the incorporation of a high conducting insert into a heat dissipating component such as a graphite heat sink base in order to conduct heat from a heat source through the thickness of the component, and from there in a planar direction. However, nothing in the Krassowski and Chen disclosure describes conducting heat from a heat source through layers of a relatively non-conductive material like a dielectric layer of a circuit assembly.

As noted, the graphite material preferred for use as the heat spreader material of this invention is sheets of compressed particles of exfoliated graphite, typically referred to as flexible graphite sheet material.

The following is a brief description of graphite and the manner in which it is typically processed to form flexible graphite sheet materials. Graphite, on a microscopic scale, is made up of layer planes of hexagonal arrays or networks of carbon atoms. These layer planes of hexagonally arranged carbon atoms are substantially flat and are oriented or ordered so as to be substantially parallel and equidistant to one another. The substantially-flat, parallel, equidistant sheets or layers of carbon atoms, usually referred to as graphene layers or basal planes, are linked or bonded together and groups thereof are arranged in crystallites. Highly-ordered graphite materials consist of crystallites of considerable size, the crystallites being highly aligned or oriented with respect to each other and having well ordered carbon layers. In other words, highly ordered graphites have a high degree of preferred crystallite orientation. It should be noted that graphites, by definition, possess anisotropic structures and thus exhibit or possess many characteristics that are highly directional, e.g., thermal and electrical conductivity and fluid diffusion.

Briefly, graphites may be characterized as laminated structures of carbon, that is, structures consisting of superposed layers or laminae of carbon atoms joined together by weak van der Waals forces. In considering the graphite structure, two axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing flexible graphite sheets possess a very high degree of orientation.

As noted above, the bonding forces holding the parallel layers of carbon atoms together are only weak van der Waals forces. Natural graphites can be chemically treated so that the spacing between the superposed carbon layers or laminae can be appreciably opened up so as to provide a marked expansion in the direction perpendicular to the layers, that is, in the "c" direction, and thus form an expanded or intumesced graphite structure in which the laminar character of the carbon layers is substantially retained.

Graphite flake which has been chemically or thermally expanded and more particularly expanded so as to have a final thickness or "c" direction dimension which is as much as about 80 or more times the original "c" direction dimension, can be formed without the use of a binder into cohesive or integrated sheets of expanded graphite, e.g. webs, papers, strips, tapes, or the like (typically referred to as "flexible graphite"). The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material, as noted above, has also been found to possess a high degree of anisotropy to thermal and electrical conductivity and fluid diffusion, somewhat less, but comparable to the natural graphite starting material due to orientation of the expanded graphite particles substantially parallel to the opposed faces of the sheet resulting from very high compression, e.g. roll processing. Sheet material thus produced has excellent flexibility, good strength and a very high degree or orientation. There is a need for processing that more fully takes advantage of these properties.

Briefly, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is as much as about 80 or more times that of the original particles so as to form a substantially flat, flexible, integrated graphite sheet. The expanded graphite particles that generally are worm-like or vermiform in appearance will, once compressed, maintain the compression set and alignment with the opposed major surfaces of the sheet. Properties of the sheets may be altered by coatings and/or the addition of binders or additives prior to the compression step. See U.S. Pat. No. 3,404,061 to Shane, et al. The density and thickness of the sheet material can be varied by controlling the degree of compression.

Lower densities are advantageous where surface detail requires embossing or molding, and lower densities aid in achieving good detail. However, higher in-plane strength and thermal conductivity are generally favored by more dense sheets. Typically, the density of the sheet material will be within the range of from about 0.04 $g/cm^3$ to about 1.9 $g/cm^3$.

Flexible graphite sheet material made as described above typically exhibits an appreciable degree of anisotropy due to the alignment of graphite particles parallel to the major opposed, parallel surfaces of the sheet, with the degree of anisotropy increasing upon roll pressing of the sheet material to increased density. In roll-pressed anisotropic sheet material, the thickness, i.e. the direction perpendicular to the opposed, parallel sheet surfaces comprises the "c" direction and the directions ranging along the length and width, i.e. along or parallel to the opposed, major surfaces comprises the "a" directions and the thermal properties of the sheet are very different, by orders of magnitude typically, for the "c" and "a" directions.

SUMMARY OF THE INVENTION

Accordingly, it is an object of the invention to provide improved constructions for vias in graphite heat spreaders.

Another object of the present invention is the provision of improved methods of manufacturing heat spreaders including thermal vias.

And another object of the present invention is the provision of a flanged via having a flange engaging one of the major surfaces of the graphite heat spreader for improved heat transfer between the via and the graphite heat spreader.

And another object of the present invention is the provision of a low cost method of manufacturing heat spreaders with vias, utilizing inexpensive push on nuts.

Another object of the present invention is the provision of a construction and methods of construction of graphite heat spreaders having flush thermal vias.

And another object of the present invention is the provision of graphite heat spreaders with thermal vias and a layer of cladding to provide structural integrity for the mounting of the heat spreader.

Still another object of the present invention is the provision of methods of co-forging thermal vias and graphite heat spreaders.

Other and further objects, features, and advantages of the present invention will be readily apparent to those skilled in the art, upon a reading of the following disclosure when taken in conjunction with the accompanying drawings.

BRIEF DESCRIPTION OF THE DRAWINGS

FIG. 7 is an elevation partly cross-section view of a graphite heat spreader with a thermal rivet type of via mounted thereon with a push on nut.

FIG. 7A is a view similar to FIG. 7 showing the optional use of the washer below the push-on nut.

FIG. 8 is a plan view of the flanged thermal via of FIG. 7.

FIG. 9 is an elevation view of the flanged thermal via of FIG. 8.

FIG. 10 is a plan view of the push on nut of FIG. 7.

FIG. 11 is an elevation cross-section view of the push on nut of FIG. 10.

FIG. 12 is a plan view of a portion of the graphite planar element of FIG. 7 showing the die cut hole therethrough within which the flanged via is received.

FIG. 13 is an elevation view of the graphite planar element of FIGS. 7 and 12 shown in cross-section.

FIG. 14 is an elevation cross-section view after a flanged via has been force fit through the die cut hole in the graphite planar element, thus creating a mushroomed fillet of graphite. Located directly above the graphite planar element and via is a punch which will be used to compress the fillet of graphite.

FIG. 15 is an elevation partly cross-sectioned view of another embodiment of the invention utilizing a thermal via having two flanges, one on each end. The heat source in this example is shown located against the lower flange, but can be located against either flange of this via. As seen in the cross-sectional portion of FIG. 15, the via is made up of two parts, one including the stem and lower flange, and the second part being the upper flange.

FIG. 15A is a view similar to FIG. 15 showing an alternative version of the dual flanged via.

FIG. 16 is a plan view of the stem and lower flange of FIG. 15.

FIG. 17 is an elevation view of the stem with integral lower flange of FIG. 16.

FIG. 18 is a plan view of the top flange before it is assembled with the thermal via of FIG. 15.

FIG. 19 is an elevation cross-sectioned view of the top flange of FIG. 18.

FIG. 20 is a view somewhat similar to FIG. 14, showing the stem of the flanged via of FIG. 17 having been pressed through the graphite planar element thus forming a mushroomed fillet of graphite. A punch is shown in place above the via ready to move downward to compress the fillet of graphite.

FIG. 21 is a plan view of an alternate construction of the flanged via.

FIG. 22 is an elevation view of the flanged via of FIG. 21.

FIG. 23 is a plan view of a second flange having a straight bore to be used with the flanged via of FIGS. 21 and 22.

FIG. 24 is an elevation sectioned view of the second flange of FIG. 23.

FIG. 25 is an elevation partly sectioned view of another embodiment of the invention having a flush via which is flush with the major planar surfaces of the graphite planar element.

FIG. 26 is a plan view of the thermal via of FIG. 25, which is in the shape of a circular disc having chamfered edges on each end.

FIG. 27 is an elevation view of the thermal via of FIG. 26.

FIG. 28 is an elevation partly cross-sectioned exploded view of a fixture used to embed the thermal via of FIGS. 26 and 27 in the graphite planar element to form the heat spreader structure shown in FIG. 25. From top to bottom FIG. 28 shows a punch, the thermal via, an upper die half, the graphite spreader, and a lower die half.

FIG. 29 is an elevation cross-sectioned view of the fixture of FIG. 28 after the punch has forced the thermal via through the upper die half and into place within the graphite spreader.

FIG. 30 is an exploded elevation sectioned view of two platens of a press for compressing the annular bulges of a graphite spreader having a flush via.

FIG. 31 is an elevation cross-sectioned view of a graphite heat spreader having a surface layer thereon.

FIG. 32 is a view similar to FIG. 25 showing the assembled graphite heat spreader having a surface layer, and including the flush thermal via and having a heat source shown in place thereon.

DETAILED DESCRIPTION OF THE INVENTION

Figure 1:
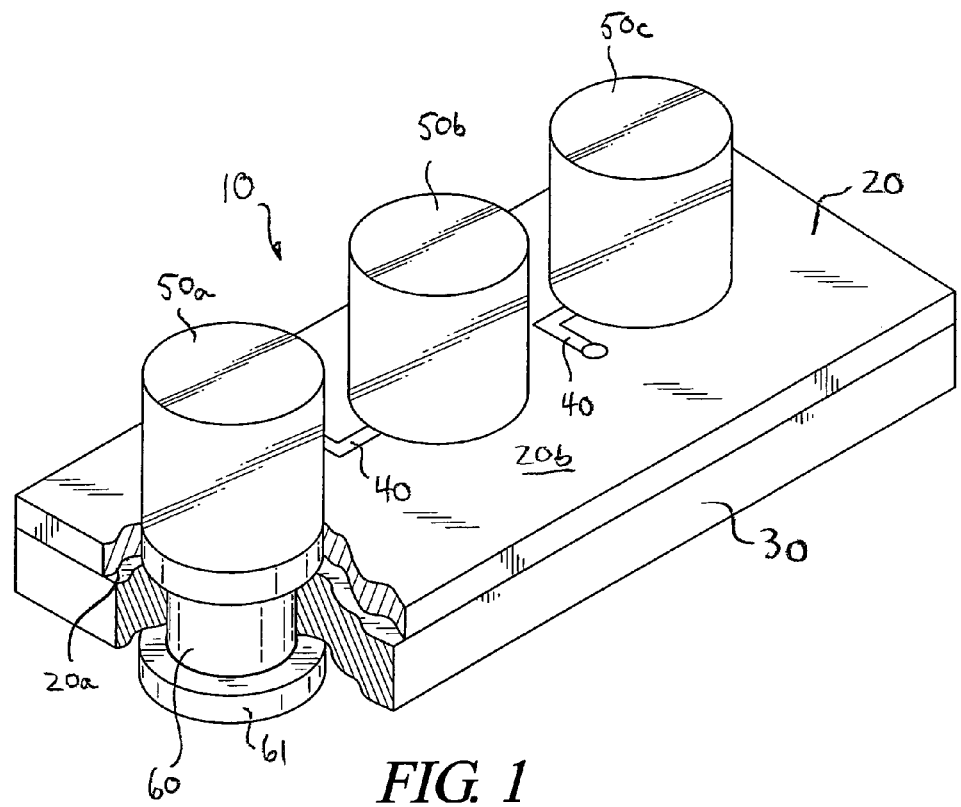
FIG. 1 is a partially broken-away perspective view of a circuit assembly in accordance with the present invention, having a heat spreader layer on one surface thereof and a thermal pathway between the heat spreader layer and a heat-generating component located on a second surface of the circuit assembly.

The present invention provides preferred constructions for and methods of manufacturing graphite heat spreaders having thermal vias. In one embodiment flanged thermal vias are provided having at least one flange which engages with one of the major planar surfaces of the graphite planar element of the graphite heat spreader. Such a flanged via may be attached to the graphite heat spreader either through the use of a push on nut or the use of a second flange which is rigidly connected to the stem of the via. Thus such flanged vias include at least one flange, and either a second flange or a push on nut all of which extend above the surface of the graphite heat spreader element. In another embodiment, flush thermal vias are provided which in the final position are flush with the major planar surfaces of the graphite heat spreader element. Various preferred techniques for manufacturing both embodiments are provided.

Both embodiments preferably involve the method of manufacture wherein the stem of the via is force fit into a similarly shaped but slightly smaller opening through the graphite planar element to provide a close fit between the stem and the opening through the graphite planar element.

One particular application of such graphite heat spreaders is its use with a circuit assembly of a printed circuit board. The heat spreading function of a heat spreader layer on a circuit assembly is substantially improved when a thermal pathway, i.e. a thermal via, between a heat-generating component, especially an LED, and the heat spreader layer is provided. Indeed, by the use of such a thermal pathway, the use of graphite-based heat spreader layers can provide improved heat spreading, even as compared to the use of aluminum or copper heat spreaders, with the added benefit of reduced weight.

By the term "circuit assembly" is meant an assembly including one or more electronic circuits positioned on a dielectric material, and can include laminates where one or more of the circuits is sandwiched between layers of dielectric material. Specific examples of circuit assemblies are printed circuit boards and flex circuits, as would be familiar to the skilled artisan.

Before describing the manner in which the invention improves current materials, a brief description of graphite and its formation into flexible sheets, which will become the primary heat spreader for forming the products of the invention, is in order.

Graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The exfoliated graphite particles are vermiform in appearance, and are therefore commonly referred to as worms. The worms may be compressed together into flexible sheets that, unlike the original graphite flakes, can be formed and cut into various shapes.

Graphite starting materials suitable for use in the present invention include highly graphitic carbonaceous materials capable of intercalating organic and inorganic acids as well as halogens and then expanding when exposed to heat. These highly graphitic carbonaceous materials most preferably have a degree of graphitization of about 1.0. As used in this disclosure, the term "degree of graphitization" refers to the value g according to the formula:

$$g = \frac{3.45 - d(002)}{0.095}$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous materials include natural graphites from various sources, as well as other carbonaceous materials such as graphite prepared by chemical vapor deposition, high temperature pyrolysis of polymers, or crystallization from molten metal solutions and the like. Natural graphite is most preferred.

The graphite starting materials used in the present invention may contain non-graphite components so long as the crystal structure of the starting materials maintains the required degree of graphitization and they are capable of exfoliation. Generally, any carbon-containing material, the crystal structure of which possesses the required degree of graphitization and which can be exfoliated, is suitable for use with the present invention. Such graphite preferably has a purity of at least about eighty weight percent. More preferably, the graphite employed for the present invention will have a purity of at least about 94%. In the most preferred embodiment, the graphite employed will have a purity of at least about 98%.

A common method for manufacturing graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 20 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

In a preferred embodiment, the intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

The quantity of intercalation solution may range from about 20 to about 350 pph and more typically about 40 to about 160 pph. After the flakes are intercalated, any excess solution is drained from the flakes and the flakes are water-washed. Alternatively, the quantity of the intercalation solution may be limited to between about 10 and about 40 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. Suitable specific organic agents include hexadecanol, octadecanol, 1-octanol, 2-octanol, decylalcohol, 1,10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

The use of an expansion aid applied prior to, during or immediately after intercalation can also provide improvements. Among these improvements can be reduced exfoliation temperature and increased expanded volume (also referred to as "worm volume"). An expansion aid in this context will advantageously be an organic material sufficiently soluble in the intercalation solution to achieve an improvement in expansion. More narrowly, organic materials of this type that contain carbon, hydrogen and oxygen, preferably exclusively, may be employed. Carboxylic acids have been found especially effective. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_nCOOH$ wherein n is a number of from 0 to about 5, including formic, acetic, propionic, butyric, pentanoic, hexanoic, and the like. In place of the carboxylic acids, the anhydrides or reactive carboxylic acid derivatives such as alkyl esters can also be employed. Representative of alkyl esters are methyl formate and ethyl formate. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representative of dicarboxylic acids are aliphatic dicarboxylic acids having 2-12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1,4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Prominent among the polycarboxylic acids is citric acid.

The intercalation solution will be aqueous and will preferably contain an amount of expansion aid of from about 1 to 10%, the amount being effective to enhance exfoliation. In the embodiment wherein the expansion aid is contacted with the graphite flake prior to or after immersing in the aqueous intercalation solution, the expansion aid can be admixed with the graphite by suitable means, such as a V-blender, typically in an amount of from about 0.2% to about 10% by weight of the graphite flake.

After intercalating the graphite flake, and following the blending of the intercalant coated intercalated graphite flake with the organic reducing agent, the blend is exposed to temperatures in the range of 25° to 125° C. to promote reaction of the reducing agent and intercalant coating. The heating period is up to about 20 hours, with shorter heating periods, e.g., at least about 10 minutes, for higher temperatures in the above-noted range. Times of one half hour or less, e.g., on the order of 10 to 25 minutes, can be employed at the higher temperatures.

The thusly treated particles of graphite are sometimes referred to as "particles of intercalated graphite." Upon exposure to high temperature, e.g. temperatures of at least about 160° C. and especially about 700° C. to 1000° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compressed together into flexible sheets that, unlike the original graphite flakes, can be formed and cut into various shapes.

Flexible graphite sheet and foil are coherent, with good handling strength, and are suitably compressed, e.g. by roll pressing, to a thickness of about 0.075 mm to 3.75 mm and a typical density of about 0.1 to 1.9 grams per cubic centimeter ($g/cm^3$). From about 1.5-30% by weight of ceramic additives can be blended with the intercalated graphite flakes as described in U.S. Pat. No. 5,902,762 (which is incorporated herein by reference) to provide enhanced resin impregnation in the final flexible graphite product. The additives include ceramic fiber particles having a length of about 0.15 to 1.5 millimeters. The width of the particles is suitably from about 0.04 to 0.004 mm. The ceramic fiber particles are non-reactive and non-adhering to graphite and are stable at temperatures up to about 1100° C., preferably about 1400° C. or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

The above described methods for intercalating and exfoliating graphite flake may beneficially be augmented by a pretreatment of the graphite flake at graphitization temperatures, i.e. temperatures in the range of about 3000° C. and above and by the inclusion in the intercalant of a lubricious additive, as described in International Patent Application No. PCT/US02/39749, the disclosure of which is incorporated herein by reference.

The pretreatment, or annealing, of the graphite flake results in significantly increased expansion (i.e., increase in expansion volume of up to 300% or greater) when the flake is subsequently subjected to intercalation and exfoliation. Indeed, desirably, the increase in expansion is at least about 50%, as compared to similar processing without the annealing step. The temperatures employed for the annealing step should not be significantly below 3000° C., because temperatures even 100° C. lower result in substantially reduced expansion.

The annealing of the present invention is performed for a period of time sufficient to result in a flake having an enhanced degree of expansion upon intercalation and subsequent exfoliation. Typically the time required will be 1 hour or more, preferably 1 to 3 hours and will most advantageously proceed in an inert environment. For maximum beneficial results, the annealed graphite flake will also be subjected to other processes known in the art to enhance the degree expansion—namely intercalation in the presence of an organic reducing agent, an intercalation aid such as an organic acid, and a surfactant wash following intercalation. Moreover, for maximum beneficial results, the intercalation step may be repeated.

The annealing step of the instant invention may be performed in an induction furnace or other such apparatus as is known and appreciated in the art of graphitization; for the temperatures here employed, which are in the range of 3000° C., are at the high end of the range encountered in graphitization processes.

Because it has been observed that the worms produced using graphite subjected to pre-intercalation annealing can sometimes "clump" together, which can negatively impact area weight uniformity, an additive that assists in the formation of "free flowing" worms is highly desirable. The addition of a lubricious additive to the intercalation solution facilitates the more uniform distribution of the worms across the bed of a compression apparatus (such as the bed of a calender station) conventionally used for compressing (or "calendering") graphite worms into flexible graphite sheet. The resulting sheet therefore has higher area weight uniformity and greater tensile strength. The lubricious additive is preferably a long chain hydrocarbon, more preferably a hydrocarbon having at least about 10 carbons. Other organic compounds having long chain hydrocarbon groups, even if other functional groups are present, can also be employed.

More preferably, the lubricious additive is an oil, with a mineral oil being most preferred, especially considering the fact that mineral oils are less prone to rancidity and odors, which can be an important consideration for long term storage. It will be noted that certain of the expansion aids detailed above also meet the definition of a lubricious additive. When these materials are used as the expansion aid, it may not be necessary to include a separate lubricious additive in the intercalant.

The lubricious additive is present in the intercalant in an amount of at least about 1.4 pph, more preferably at least about 1.8 pph. Although the upper limit of the inclusion of lubricous additive is not as critical as the lower limit, there does not appear to be any significant additional advantage to including the lubricious additive at a level of greater than about 4 pph.

The flexible graphite sheets of the present invention may, if desired, utilize particles of reground flexible graphite sheets rather than freshly expanded worms, as discussed in U.S. Pat. No. 6,673,289 to Reynolds, Norley and Greinke, the disclosure of which is incorporated herein by reference. The sheets may be newly formed sheet material, recycled sheet material, scrap sheet material, or any other suitable source.

Also the processes of the present invention may use a blend of virgin materials and recycled materials.

The source material for recycled materials may be sheets or trimmed portions of sheets that have been compression molded as described above, or sheets that have been compressed with, for example, pre-calendering rolls, but have not yet been impregnated with resin. Furthermore, the source material may be sheets or trimmed portions of sheets that have been impregnated with resin, but not yet cured, or sheets or trimmed portions of sheets that have been impregnated with resin and cured. The source material may also be recycled flexible graphite proton exchange membrane (PEM) fuel cell components such as flow field plates or electrodes. Each of the various sources of graphite may be used as is or blended with natural graphite flakes.

Once the source material of flexible graphite sheets is available, it can then be comminuted by known processes or devices, such as a jet mill, air mill, blender, etc. to produce particles. Preferably, a majority of the particles have a diameter such that they will pass through 20 U.S. mesh; more preferably a major portion (greater than about 20%, most preferably greater than about 50%) will not pass through 80 U.S. mesh. Most preferably the particles have a particle size of no greater than about 20 U.S. mesh. It may be desirable to cool the flexible graphite sheet when it is resin-impregnated as it is being comminuted to avoid heat damage to the resin system during the comminution process.

The size of the comminuted particles may be chosen so as to balance machinability and formability of the graphite article with the thermal characteristics desired. Thus, smaller particles will result in a graphite article which is easier to machine and/or form, whereas larger particles will result in a graphite article having higher anisotropy, and, therefore, greater in-plane electrical and thermal conductivity.

Once the source material is comminuted, it is then re-expanded. The re-expansion may occur by using the intercalation and exfoliation process described above and those described in U.S. Pat. No. 3,404,061 to Shane et al. and U.S. Pat. No. 4,895,713 to Greinke et al.

Typically, after intercalation the particles are exfoliated by heating the intercalated particles in a furnace. During this exfoliation step, intercalated natural graphite flakes may be added to the recycled intercalated particles. Preferably, during the re-expansion step the particles are expanded to have a specific volume in the range of at least about 100 cc/g and up to about 350 cc/g or greater. Finally, after the re-expansion step, the re-expanded particles may be compressed into flexible sheets, as hereinafter described.

According to the invention, graphite sheets prepared as described above (which typically have a thickness of about 0.075 mm to about 10 mm, but which can vary depending, e.g., on the degree of compression employed) are can be treated with resin and the absorbed resin, after curing, enhances the moisture resistance and handling strength, i.e. stiffness, of the sheet as well as "fixing" the morphology of the sheet. The amount of resin within the epoxy impregnated graphite sheets should be an amount sufficient to ensure that the final assembled and cured layered structure is dense and cohesive, yet the anisotropic thermal conductivity associated with a densified graphite structure has not been adversely impacted. Suitable resin content is preferably at least about 5% by weight, more preferably about 10 to 35% by weight, and suitably up to about 60% by weight.

Resins found especially useful in the practice of the present invention include acrylic-, epoxy- and phenolic-based resin systems, fluoro-based polymers, or mixtures thereof. Suitable epoxy resin systems include those based on diglycidyl ether of bisphenol A (DGEBA) and other multifunctional resin systems; phenolic resins that can be employed include resole and novolac phenolics. Optionally, the flexible graphite may be impregnated with fibers and/or salts in addition to the resin or in place of the resin. Additionally, reactive or non-reactive additives may be employed with the resin system to modify properties (such as tack, material flow, hydrophobicity, etc.).

One type of apparatus for continuously forming resin-impregnated and compressed flexible graphite materials is shown in U.S. Pat. No. 6,706,400 to Mercuri, Capp, Warddrip and Weber, the disclosure of which is incorporated herein by reference.

Advantageously, when the sheets of compressed particles of exfoliated graphite are resin-impregnated, following the compression step (such as by calendering), the impregnated materials are cut to suitable-sized pieces and placed in a press, where the resin is cured at an elevated temperature. In addition, the flexible graphite sheets can be employed in the form of a laminate, which can be prepared by stacking together individual graphite sheets in the press.

The temperature employed in the press should be sufficient to ensure that the graphite structure is densified at the curing pressure, while the thermal properties of the structure are not adversely impacted. Generally, this will require a temperature of at least about 90° C., and generally up to about 200° C. Most preferably, cure is at a temperature of from about 150° C. to 200° C. The pressure employed for curing will be somewhat a function of the temperature utilized, but will be sufficient to ensure that the graphite structure is densified without adversely impacting the thermal properties of the structure. Generally, for convenience of manufacture, the minimum required pressure to density the structure to the required degree will be utilized. Such a pressure will generally be at least about 7 megapascals (Mpa, equivalent to about 1000 pounds per square inch), and need not be more than about 35 Mpa (equivalent to about 5000 psi), and more commonly from about 7 to about 21 Mpa (1000 to 3000 psi). The curing time may vary depending on the resin system and the temperature and pressure employed, but generally will range from about 0.5 hours to 2 hours. After curing is complete, the materials are seen to have a density of at least about 1.8 g/cm$^3$ and commonly from about 1.8 g/cm$^3$ to 2.0 g/cm$^3$.

Advantageously, when the flexible graphite sheets are themselves presented as a laminate, the resin present in the impregnated sheets can act as the adhesive for the laminate. According to another embodiment of the invention, however, the calendered, impregnated, flexible graphite sheets are coated with an adhesive before the flexible sheets are stacked and cured. Suitable adhesives include epoxy-, acrlylic- and phenolic-based resins. Phenolic resins found especially useful in the practice of the present invention include phenolic-based resin systems including resole and novolak phenolics.

Although the formation of sheets through calendering or molding is the most common method of formation of the graphite materials useful in the practice of the present invention, other forming methods can also be employed.

The temperature- and pressure-cured graphite/resin composites of the present invention provide a graphite-based composite material having in-plane thermal conductivity rivaling or exceeding that of copper, at a fraction of the weight of copper. More specifically, the composites exhibit in-plane thermal conductivities of at least about 300 W/m°K, with through-plane thermal conductivities of less than about 15 W/m°K, more preferably less than about 10 W/m°K.

Referring now to the drawings, and, in particular, FIG. 1, a circuit assembly incorporating a graphite heat spreader with thermal vias in accordance with the invention is denoted by the reference numeral 10. Circuit assembly 10 includes at least a dielectric layer 20 and a heat spreader layer 30, where heat spreader layer 30 abuts dielectric layer 20. Preferably, heat spreader layer 30 comprises at least one sheet of compressed particles of exfoliated graphite, prepared as described above. Circuit assembly 10 is generally either a printed circuit board or flex circuit, but can also comprise, for example, a printed or silk-screened pattern of conductive ink on dielectric layer 20.

Circuit assembly 10 also generally comprises a circuit 40 thereon, conventionally formed of copper, applied to dielectric layer 20 by photolithographic methods, sputtering, screen printing or the like. As noted above, circuit 40 can also be formed of a conductive ink applied to dielectric layer 20 by, for example, printing or silk-screening processes.

Dielectric layer 20 can be that conventional in the printed circuit board industry, such as glass fiber with resin (FR-4), preferably formed as a laminate; polytetrafluoroethylene (PTFE), commercially available as Teflon brand materials; and expanded PTFE, sometimes denoted ePTFE, as well as resin-impregnated or imbibed versions of the foregoing. In addition, dielectric layer 20 can be a polymer such as a polyimide or polyester, as used in the formation of flex circuits. Dielectric layer 20 can also comprise a ceramic material, such as aluminum nitride, aluminum oxide or alumina, present as a discrete layer, or applied to a substrate layer (such as heat spreader layer 30) through, for example, an anodization, vapor deposition, or flame-spraying process; the use of anodization is especially relevant where heat spreader layer 30 is aluminum.

In addition, in certain circumstances it may be desirable to at least partially encapsulate heat spreader layer 30 or provide a coating on a surface of heat spreader layer 30 to prevent particulate matter from flaking off heat spreader layer 30. For instance, there is the perception by some that graphite materials are prone to flaking. Whether true or not, providing a coating of a polymeric material (typically on the order of less than 20 microns in thickness) such as Mylar material to inhibit flaking can allay this perception. In this case, the polymeric material can act as dielectric layer 20 for circuit assembly 10, since the material used can be electrically non-conductive, yet thin enough to not substantially interfere with thermal conduction to heat spreader layer 30. Alternatively, an anodized aluminum layer can also be used to inhibit flaking, with the anodization layer also acting as dielectric layer 20.

Preferably, heat spreader layer 30 is from about 0.25 mm to about 25 mm in thickness, more preferably from about 0.5 mm to about 14 mm in thickness, and comprises at least one graphite sheet. Advantageously, heat spreader layer 30 can be a laminate of up to ten or more graphite sheets, to provide the desired heat spreading capabilities. The graphite composite can be used to at least partially, and, in the preferred embodiments, completely replace the use of copper or other metals as the circuit assembly heat spreader.

Surprisingly, when heat spreader layer 30, especially when formed of one or more sheets of compressed particles of exfoliated graphite, is rendered black, such as by painting, improved thermal resistance is observed. In other words, where those surfaces of graphite heat spreader layer 30 not abutting dielectric layer 20 are black, the effective thermal resistance of the heat path from the heat generating component is decreased. Although the precise reason for this is not known, it is believed that rendering graphite heat spreader layer 30 black improves the emissivity of spreader layer 30, thereby improving the ability of heat spreader layer 30 to radiate heat.

Heat spreader layer 30 is not necessarily planar, but may include one or more "bends," to form a 3-dimensional shape. This is especially advantageous where it is desired that circuit assembly 10 is on a different plane from heat spreader layer 30. This arrangement is employed in sidelit liquid crystal displays ("LCD displays"), for example, where LEDs are mounted on circuit assembly 10 in a plane with limited space (i.e., the thickness of the LCD display), and heat spreader layer 30 extends perpendicular to the LED mounting plane.

Indeed, in one embodiment of the invention, heat spreader layer 30 has a larger surface area than dielectric layer 20 and any circuit 40 thereon. In this way, dielectric layer 20 and heat-generating component(s) 50, as well as circuit(s) 40, can lie in one plane (such as the LED plane for sidelit LCD displays), while heat spreader layer 30 can extend into another plane (such as a perpendicular plane, with an approximately 90° bend, as in the rear plane of the LCD display), as described above, and thereby spread heat into such other plane for additional dissipation.

The graphite/dielectric material laminate can be formed by laminating together dielectric layers 20 and heat spreader layer 30 in a manner conventional in the formation of circuit assembly laminates, using conventional adhesives, for instance. Alternatively, graphite/dielectric material laminate can be formed in the pre-pressed stack while pressure curing the graphite materials. The epoxy polymer in the impregnated graphite sheets is sufficient, upon curing, to adhesively bond the non-graphite as well as the impregnated graphite layers of the structure into place. In any event, in the preferred embodiment, a graphite composite is employed as heat spreader layer 30 for circuit assembly 10, to replace the copper or aluminum heat spreader in a so-called "metal-backed" printed circuit board or in a flex circuit.

As noted above, dielectric material 20 forming the central portion of circuit assembly 10 has two major surfaces 20a and 20b. Heat spreader layer 30 abuts one of the surfaces 20a of dielectric material 20; the other surface 20b has located thereon at least one heat generating component 50, and often a plurality of heat generating components 50a, 50b, 50c, etc., such as LEDs, chipsets, or other components familiar to the skilled artisan. Heat generating component 50 is located so as to be in contact with a portion of circuit 40 lying on surface 20b of circuit assembly 10 on which component 50 is located.

Certain manufacturers' LEDs include thermal slugs to help dissipate heat from the LED itself; these thermal slugs are often not considered to be electrically neutral. Accordingly, when more than one of such LEDs is located on circuit assembly 10, care must be taken to avoid electrical shorts between the slugs on two or more LEDs on the assembly; thus, the respective LEDs must often be electrically isolated.

In order to facilitate the transfer of heat from heat generating component 50 to heat spreader layer 30, a thermal pathway 60, also referred to as a thermal via or simply a via 60, extends through heat spreader layer 30, adjacent heat generating component 50. Advantageously, via 60 also extends through circuit assembly 10 between each heat generating component 50 and heat spreader layer 30. Via 60 comprises a slug or "rivet" of a high thermal conductivity material, such as copper or alloys thereof, although other high thermal conductivity materials like aluminum or compressed particles of exfoliated graphite can be used. By "high thermal conductivity" is meant that the thermal conductivity of via 60 in the direction between heat generating component 50 and heat spreader layer 30 is greater than the through-thickness thermal conductivity of dielectric layer 30; preferably, the thermal conductivity of via 60 is at least about 100 W/m°K, more preferably at least about 200 W/m°K, and even more preferably above 350 W/m°K. Each via 60 can assume any particular cross-sectional shape, although most commonly, via 60 will be cylindrical in shape.

Via 60 can be a single integral element, but may also comprise more than one piece, such as a pair of separate parts that are press-fit or otherwise attached together as further described below with reference to FIGS. 7-27. In addition, via 60 may advantageously have a shoulder or step on the side adjacent dielectric layer, for positional considerations. If electrical isolation is required a dielectric layer, such as anodized aluminum, aluminum nitride, aluminum oxide or alumina, can be placed onto some or all surfaces of the via 60, like flame-sprayed or vapor deposited alumina on copper, or through the use of anodized aluminum as via 60, for example. In addition, surfaces of via 60 can remain solderable, or can be plated to be solderable, to facilitate joinder of heat generating component 50 to via 60.

Each via 60 extends into heat spreader layer 30 and is brought into thermal contact with heat spreader layer 30. For instance, via 60 can be fitted into a slot or hole in heat spreader layer 30 using a thermal adhesive or a pressure fitting, such as a so-called "speed nut," or press-on nut in order to ensure good thermal contact between via 60 and heat spreader layer 30, and to ensure heat transfer from via 60 across the thickness of spreader layer 30. One suitable way via 60 is fitted into spreader layer 30 so as to establish adequate thermal contact is to force via 60 through an opening in spreader layer 30 which has a diameter smaller than that of via 60 as illustrated for example in FIGS. 14, 20, 30 and 36 below; in this way, the act of forcing via 60 through the opening provides a pressure fitting between the two. Alternatively, the hole in spreader layer 30 can be formed by using via 60 itself as a punch. The nature of sheets of compressed particles of exfoliated graphite can permit such a fitting to be accomplished without undue damage to either thermal pathway 60 or heat spreader layer 30.

Figures 2A, 2B, 2C:
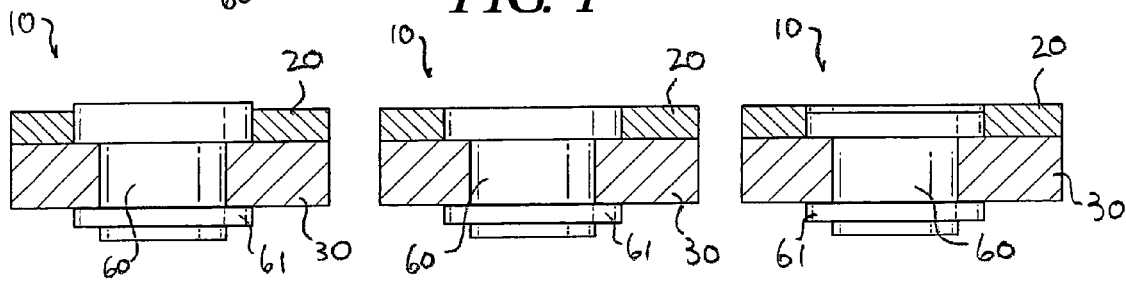
FIGS. 2A-2C are partial cross sectional views of different alternative arrangements of the thermal pathway of the circuit assembly of FIG. 1, showing taken along line 2-2 of FIG. 1 and showing the thermal pathway extending above, flush with and recessed into the second surface of the circuit assembly, respectively.

Similarly, via 60 needs to be in good thermal contact with heat generating component 50. Thus, via 60 needs to be thermally connected to heat generating component 50 or adhered thereto using solder, a thermal grease, a thermal adhesive like an epoxy, a sheet of compressed particles of exfoliated graphite, or the like. As such, via 60 preferably extends through circuit assembly 10 and is exposed at the surface of circuit assembly 10 on which heat generating component 50 is located. Thus, in this embodiment, via 60 has a length approximately equal to the combined thickness of dielectric layer 20 and heat spreader layer 30, plus any distance via 60 extends from either dielectric layer 20 or heat spreader layer 30, as shown in FIG. 2A. Alternatively, thermal vias or a thermally conductive dielectric material may be used to transfer heat from heat generating component to via 60, with via 60 extending only through heat spreader layer 30 to spread heat through the thickness of heat spreader layer 30; therefore, in this situation, via 60 will have a length approximately equal to the thickness of heat spreader layer 30, plus any distance via 60 extends from the surface of heat spreader layer 30.

In order to provide good thermal contact between via 60 and heat generating component 50, via 60 can extend above the surface 20b of dielectric layer 20, as shown in FIG. 2A. Alternatively, via 60 can lie flush with surface 20b of dielectric layer 20, as shown in FIG. 2B, or be recessed with respect to surface 20b of dielectric layer 20, as shown in FIG. 2C, depending on the nature of heat generating component 50 and the preferred method of providing thermal attachment between via 60 and heat generating component 50.

One advantageous method for providing good thermal contact between via 60 and heat spreader layer 30 is by the use of a "rivet"-type via 60 as described below with reference to FIGS. 7-27. In this way, in the same manner a rivet is compressed to seal against a substrate, a rivet-style via 60 can be compressed or forced to seal against the outer surface of heat spreader layer 30 (i.e., the surface not abutting the dielectric layer), creating a good thermal connection between the two.

As noted above, heat spreader layer 30 is advantageously laminated or adhered to dielectric layer 20. However, it is contemplated that the use of via 60 can permit a gap to be present between heat spreader layer 30 and dielectric layer 20, to optimize heat dissipation. In other words, since heat transfer between heat generating component 50 and heat spreader layer 30 is primarily through via 60, as opposed to primarily through dielectric layer 20, it is not necessary for heat spreader layer 30 to be in contact with dielectric layer 20. Thus, a gap, of up to about 1 mm or even greater, can be provided between heat spreader layer 30 and dielectric layer 20, such as by the use of spacers, etc. (not shown). In this way, provided heat spreader layer 30 remains in thermal contact with via 60, more surface area of heat spreader layer 30 is exposed, and more heat can be dissipated therefrom. Put simply, in this embodiment, heat spreader layer 30 acts as both a heat spreader and a heat dissipation fin.

Figure 4:
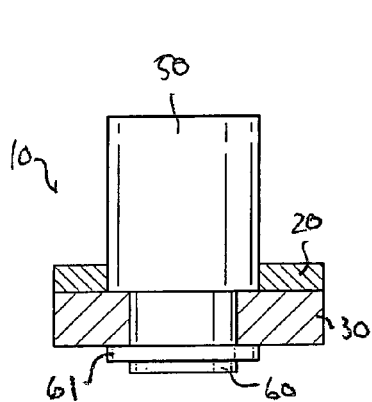
FIG. 4 is a partial cross-sectional view of a circuit assembly in accordance with the present invention, having a heat spreader layer on one surface thereof and a thermal pathway between the heat spreader layer and a heat-generating component located on a second surface of the circuit assembly, wherein the thermal pathway is integral with the heat-generating component.

In an alternative embodiment illustrated in FIG. 4, via 60 can be integral with heat generating component 50. For instance, an LED, if used as heat generating component 50, can have a high thermal conductivity slug or rivet extending therefrom, which can then extend through circuit assembly 10 and into thermal contact with heat spreader layer 30 (for instance, through a pressure fitting or rivet-style connection, as discussed above), to facilitate heat spreading from the LED to heat spreader layer 30.

Figure 6A:
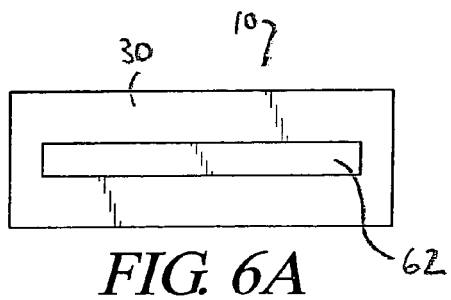
FIG. 6A is a bottom plan view of a circuit assembly in accordance with the present invention, having an elongated-base thermal pathway collection.
Figure 6B:
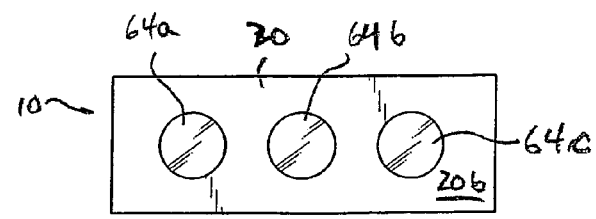
FIG. 6B is a top plan view of the circuit assembly of FIG. 6A.

In still another embodiment of the invention, shown in FIGS. 6A and 6B, via(s) 60 can be present on a collection bar 62 extending through heat spreader layer 30, where collection bar 62 comprises an elongate member having individual via units 64a, 64b, 64c, etc. extending therefrom and up through dielectric layer 20, as shown in FIG. 6B. Alternatively, a collection bar can extend through dielectric layer 20, with individual via units extending through heat spreader layer 30 (not shown).

Figure 5:
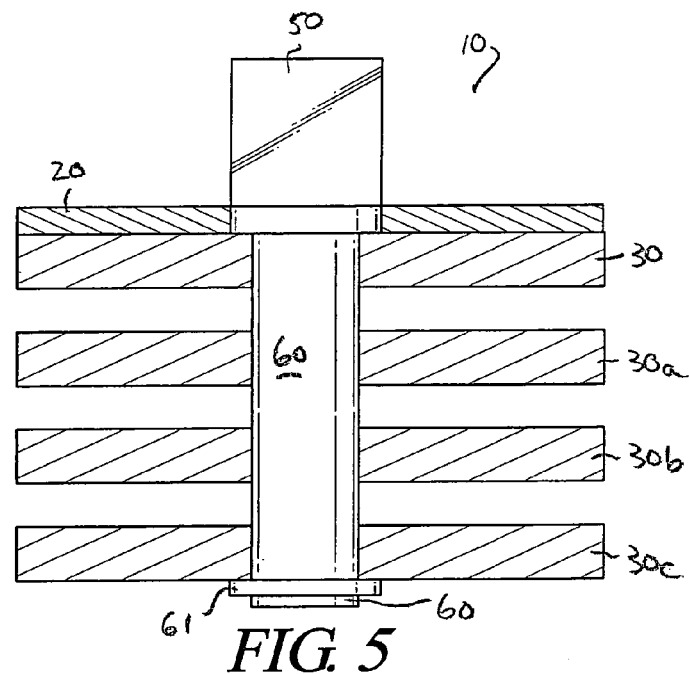
FIG. 5 is a partial cross-sectional view of a circuit assembly in accordance with the present invention, having a heat spreader layer on one surface thereof and a thermal pathway between the heat spreader layer and a heat-generating component located on a second surface of the circuit assembly, wherein the thermal pathway extends beyond the heat spreader layer and supports additional heat dissipation layers.

In yet another embodiment of the invention, as illustrated in FIG. 5, via 60 can extend through and beyond heat spreader layer 30, in order to act as a support for further heat dissipation layers 30a, 30b, 30c, etc., such as heat spreader layers or heat dissipation fins. In other words, if space allows, via 60 can extend through heat spreader layer 30, and other heat spreader layers or heat dissipation fins 30a, 30b, 30c, etc. (preferably also formed of sheets of compressed particles of exfoliated graphite) can then be placed in thermal contact with via 60 and, with an air gap between the additional layers or fins 30a, 30b, 30c, etc., provide additional heat dissipation. Spacers (not shown) can be employed to maintain the separation of layers 30a, 30b, 30c, etc.

Figure 3:
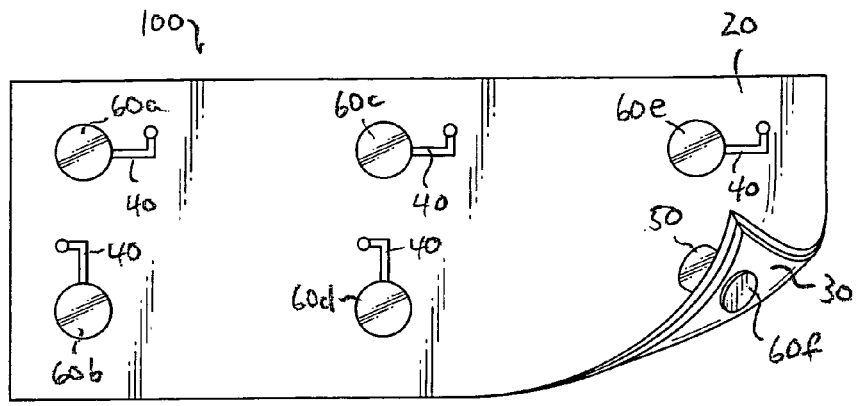
FIG. 3 is a partially broken-away perspective view of a flex circuit in accordance with the present invention, having a heat spreader layer on one surface thereof and a plurality of thermal pathways between the heat spreader layer and heat-generating components located on a second surface of the flex circuit.

As illustrated in FIG. 3, the present invention is especially useful when the circuit assembly is a flex circuit 100. Because of the nature of flex circuit 100, conventional heat spreader materials, which are relatively rigid as compared with compressed sheets of exfoliated graphite, are impractical. However, the use of one or more compressed sheets of exfoliated graphite as heat spreader layer 30 will effectively spread heat from a heat generating component 50, through via 60 without severely compromising flexibility. Moreover, since each via 60 is often a discrete article, even the inclusion of a plurality of vias 60a, 60b, 60c, etc. will not substantially compromise flexibility.

Accordingly, by the use of the present invention, effective heat spreading in a circuit assembly can be accomplished to a degree not heretofore seen, even in the case of flex circuits and even where the heat source is an LED.

Flanged Vias

FIGS. 7-27 illustrate constructions for flanged vias and illustrate methods of assembling flanged vias with graphite planar elements.

1. Low Cost Thermal Rivet

In some applications, it will be permissible or necessary for the thermal via to protrude above the surface of the spreader. Also, in some applications it will be necessary to reduce the cost of the spreader while still trying to maximize heat flow through the spreader. These conflicting objectives can be met by using a flanged, rivet style via in the spreader, as illustrated in FIG. 7.

In FIG. 7 a thermal management system is generally designated by the numeral 100. The system 100 includes an anisotropic graphite planar element 102 having first and second oppositely facing planar surfaces 104 and 106, and having a thickness 108 defined between the planar surfaces. The planar element 102 has a relatively high thermal conductivity parallel to the planar surfaces 104 and 106 and a relatively low thermal conductivity across the thickness 108. The planar element 102 has a circular cavity or hole 110 defined therethrough between the planar surfaces 104 and 106, the cavity 110 being defined by a cylindrical inner cavity wall 112. A rivet style thermal via 114 has a cylindrical stem 116 extending through the cavity 110 and closely engaging the inner cavity wall 112. Via 114 further includes a flange 118 extending laterally from the stem 116 and closely engaging the first planar surface 104 of the graphite planar element 102.

As previously noted the via 114 is preferably constructed of an isotropic material so that heat from a heat source such as 120 can be conducted through the via 114 into the thickness 108 of the planar element 102. The via 114 is preferably constructed from a material selected from the group consisting of gold, silver, copper, aluminum and their alloys. The anisotropic graphite planar element 102 is preferably manufactured from compressed particles of exfoliated graphite.

As is apparent in FIG. 7, the flanged end 118 of the rivet style via 114 protrudes from one side of the graphite planar element 102 while the stem 116 protrudes from the other side of the graphite planar element 102. The rivet style via 114 is sized so that the diameter of the stem 116 is large enough to cover approximately the entire surface of the heat source 120.

The flanged via 114 is retained in place with the graphite planar element 102 by pressing a commercially available, push-on nut 122 over the stem 116 of the via 114. The push-on nut 122 need not be made from the same material as the via 114, since it does not contribute to heat transfer; its only purpose is to retain the rivet style via 114 in place with the graphite planar element 102. The inside diameter of the push-on nut 122 is slightly smaller than the outside diameter of the stem 116, so that the push-on nut makes intimate contact with the stem 116 of the via 114. An upper end or free end 124 of the via 114 contacts the heat source 120 and heat flows from the heat source 120 into the stem 116 and the flange 118 of the via 114. Heat is transferred into the graphite planar element 102 through both the outside diameter of the stem 116 and the inside surface 126 of the flange 118. Since the flange 118 contacts the first side 104 of the graphite planar element 102 opposite from the heat source 120, heat transferred to the graphite planar element 102 is maximized.

It will be appreciated that there is a contact area between the heat source 120 and the free end 124 of stem 116, which may be referred to as a heat conducting contact area defined on the heat source 120. That contact area is preferably less than an area of the end 124 of the stem 116, although it is possible for the heat source to be modestly larger than the area of the end 124 of stem 116 and for the advantages of the invention to still be substantially achieved.

The push-on nut 122 is received over and frictionally engages the stem 116. The push-on nut 122 snugly engages the second planar surface 106 of graphite planar element 102, so that the graphite planar element 102 is sandwiched between the flange 118 and the push-on nut 122. In the example shown in FIG. 7, the free end 124 of stem 116 extends entirely through and past the push-on nut 122.

The diameter and thickness of the rivet flange 118 should be chosen to ensure good heat transfer into the graphite planar element 102. The diameter of the flange 118 should also be large enough so that the flange 118 does not generate excessive pressure or cut into the graphite planar element 102 when the push-on nut 122 is pressed down. If the outside diameter of the push-on nut 122 cannot be increased sufficiently to prevent damage to the graphite planar element 102 from excessive pressure, then a larger diameter washer 128 can be used under the nut 122 as shown in FIG. 7A. Since the washer 128 is used primarily for mechanical purposes (i.e. not to conduct heat), it can fit loosely on the rivet stem 116 and does not need to be made from the same material as the thermal via 114.

FIGS. 8 and 9 show detailed plan and elevation views, respectively, of the thermal via 114. FIGS. 10 and 11 show plan and elevation views, respectively, of the push-on nut 122.

To use the rivet style thermal via 114, the hole 110 is preferably die cut into the graphite planar element 102 as best shown in FIG. 12. Die cutting produces a hole diameter with a large tolerance associated with it. To ensure good heat transfer between the thermal via 114 and the graphite planar element 102, the diameter 130 of the die cut hole 110 is preferably chosen so that the largest resulting hole is still slightly smaller than the outside diameter of stem 116 of the via 114.

As best shown in FIG. 14, after the hole 110 is die cut into the graphite planar element 102, the stem 116 of via 114 is pushed, upward in the case illustrated in FIG. 14, through the hole 110. Since the stem 116 of the via 114 has a slightly larger diameter than the hole 110, the graphite will mushroom up around the stem 116 creating an annular mushroomed protrusion 132.

To ensure good heat transfer, this mushroomed protrusion 132 is then forced down flush with the top surface or second planar surface 106 of graphite planar element 102 by pressing down on the mushroomed protrusion 132 with a punch 134 shown in FIG. 14. The punch 134 has a cylindrical recess 136 in it that is sized slightly larger than the outside diameter of the rivet stem 116.

After the mushroomed protrusion 132 has been pressed flat, the push-on nut 122 is placed over the free end 124 of stem 116 and forced down the stem 116 against the graphite planar element to the location as illustrated in the final assembly of FIG. 7. Another punch (not shown) similar to the punch 134 shown in FIG. 14, with a larger recess to accommodate the raised area of the push-on nut 122, can be used to accomplish the placement of the push-on nut 122 over the stem 116. Sufficient force should be used to firmly clamp the graphite planar element 102 between the push-on nut 122 and the rivet flange 118 to ensure good heat transfer through the rivet flange 118.

Although in the example illustrated in FIGS. 7-14, the hole 110 is circular and the stem 116 is also circular or cylindrical, it will be appreciated that other cross-sectional shapes could be used. More generally, the hole 110 can be described as having a cross-sectional shape having a maximum cross-sectional dimension parallel to the plane of the planar element 102, which in the case illustrated the maximum cross-sectional dimension is the diameter 130 seen in FIG. 12. Similarly, the stem 116 of via 114 can be described as having a cross-sectional shape complementary to the cross-sectional shape of the hole 110 and having a minimum cross-sectional dimension, which in this example is the outside diameter of stem 116, larger than the maximum cross-sectional dimension 130 of hole 110. Alternatively, if the hole 110 is larger than stem 116, the gap between them should be filled with a thermally conductive grease or the like to maximize heat transfer between the graphite planar element 102 and the via 114.

2. Flanged Via With Dual Flanges

As noted, in some applications it will be necessary for the via to protrude above the surface of the graphite heat spreader element so that it can contact the heat source. In addition, in very high performance applications, it will be important to minimize as much as possible the thermal resistance between the via and the surrounding graphite material. This can be accomplished by incorporating a round, flanged via and washer assembly, which may also be referred to as a dual flanged via, such as illustrated in FIG. 15.

In FIG. 15 an alternative embodiment of the present invention includes a thermal management system generally designated by the numeral 200. Thermal management system 200 includes a graphite planar element 202 similar to the graphite planar element 102 previously described with regard to FIG. 7. Graphite planar element 202 has first and second opposed major planar surfaces 204 and 206, respectively. A thickness 208 is defined between the surfaces 204 and 206. A hole 210 defined by inner wall 212 is defined through the graphite planar element 202. System 200 includes a thermal via 214 which in this case is made up of first and second parts 215 and 217. The first part 215 comprises a stem 216 and a first flange 218.

In this case the thermal via 214 is held in place assembled with the graphite planar element 202 by the second part 217 which may also be referred to as a washer or second flange 217. The second flange 217 is made of the same material as the stem 216 and first flange 218 of the first part 215 of via 214.

Detailed plan and cross-section elevation views, respectively, of the second flange 217 are shown in FIGS. 18 and 19, respectively. The second flange 217 has an inside diameter 219 which is selected to be slightly smaller than the outside diameter of the stem 216, so that the inside diameter 219 of the second flange 217 makes intimate contact with the stem 216 wherein the second flange 217 is press fit upon the stem 216. Preferably the outside diameter of second flange 217 is generally the same as the outside diameter of first flange 218. A length 221 of the stem 216 is sized so that the graphite planar element 202 will be compressed between the first and second flanges 218 and 217, so that both the first and second flanges 218 and 217 are in intimate heat conducting engagement with the graphite planar element 202.

Although the first and second parts 215 and 217 of thermal via 214 have been described as being preferably assembled by press fitting the second part 217 upon the first part 215, it will be appreciated that other assembly techniques could be utilized. For example, the second part 217 could be shrink fit upon the stem 216, or the two parts could be welded together.

In the embodiment illustrated in FIGS. 15-19, the stem 216 has a stem shoulder 223 defined thereon and facing away from the first flange 218. Similarly, the inner bore 219 of the second flange 217 has a flange shoulder 225 defined thereon complementary to and abutting the stem shoulder 223.

In FIG. 15A, an alternative embodiment of the dual-flanged thermal management system is shown and generally designated by the numeral 200A. Thermal management system 200A is identical to thermal management system 200 of FIG. 15, except that the design of the second flange 217A is modified so that instead of being washer shaped with a through bore, it is cap shaped and has a blind bore. Otherwise the description above of thermal management system 200 of FIG. 15 is equally applicable to thermal management system 200A of FIG. 15A.

With the dual flanged via 214 of FIGS. 15-19, a heat source such as 220 can contact either the first flange 218 or the second flange 217. Preferably, the stem 216 will have a diameter at least as large as the outside diameter or maximum dimension of source 220 to aid in efficient heat transfer across the entire contact area between the source 220 and the via 214.

With the dual flanged via 214 of FIGS. 15-19 heat is transferred into the graphite planar element 202 through both the outside diameter of the stem 216 and the inside surfaces of both flanges 218 and 217. The large amount of contact surface between the via 214 and the graphite planar element 202 inherent in this design maximizes heat transfer to the graphite planar element 202, as contrasted to the single flanged via of FIG. 7 which only transfers heat through the stem and one flange.

When the second flange 217 is assembled with the first part 215 of via 214, the shoulders 225 and 223 are butted together. A length 227 of the larger diameter portion of stem 216 is chosen to be smaller than the thickness 208 of the graphite planar element 202, so as to ensure that when the second flange 217 is pressed onto the first part 215 and the shoulders 223 and 225 abut, the annular graphite area between the flanges 218 and 217 will be placed in compression. This ensures good heat transfer from the flanges 218 and 217 into the graphite planar element 202.

FIG. 20 illustrates the installation of the first part 215 of via 214 into place within the graphite planar element 202. The graphite planar element 202 will have the hole 210 die cut therein in a manner similar to described above with reference to FIG. 12 for the graphite planar element 102. Again the diameter of the die cut hole 210 is chosen so that the largest resulting hole is slightly smaller than the smallest possible diameter of the larger portion of stem 216. The first part 215 of thermal via 214 is pushed up into the hole 210 of graphite planar element 202 as shown in FIG. 20 again forming an annular mushroomed protrusion 232. To ensure good heat transfer, this mushroomed protrusion 232 is forced down flush with the top surface 206 of graphite planar element 202 by use of the punch 234 shown in FIG. 20. Again the punch 234 has a cylindrical recess 236 in it that is sized slightly larger than the maximum outside diameter of the stem 216.

After the mushroomed protrusion 232 has been pressed flat, the second flange 217 is placed on the end of the stem 216 and sufficient force is applied to push the second flange 217 down upon the stem 216 until the shoulders 223 and 225 seat against each other.

The diameter and thickness of the flanges 218 and 217 should be chosen to ensure good heat transfer into the graphite planar element 202. These diameters should also be large enough so that the flanges 218 and 217 do not generate excessive pressure or cut into the graphite planar element when the second flange 217 is pressed down upon the stem 216.

FIGS. 21-24 illustrate a second design of the dual flanged via 214A which again includes a first part 215A and a second part 217A. The only difference as compared to FIGS. 16-17, is that in this embodiment no shoulder is machined into the stem 216A. Instead the stem 216A is a straight cylindrical stem with a slight chamfer at its upper end. Similarly, the second flange 217A has a straight cylindrical bore 219A therethrough. The diameter of the stem 216A is slightly larger than the inside diameter 219A of second flange 217A, thus providing for an interference fit between the stem 216A and the second washer 217A. At assembly, a solid punch (not shown) is used to force the second flange 217A down onto the stem 216A. Motion stops when the upper surface 229 of second flange 217A is flush with the upper end 231 of stem 216A. To control the amount of compression in the graphite planar element between the first and second flanges 218A and 217A, a length 233 of stem 216A and a thickness 235 of second flange 217A are controlled.

3. Flush Thermal Vias

The thermal vias described above have all had either one or two flanges protruding above the surfaces of the graphite planar element. In some applications, however, it will be necessary for the heat spreader to have a completely flush face, that is no portion of the thermal via can protrude above the surface of the spreader. These objectives can be met using a thermal via that has been embedded into the graphite spreader as illustrated for example in FIG. 25.

FIG. 25 illustrates a thermal management system 300 including a graphite planar element 302 having first and second major planar surfaces 304 and 306. Graphite planar element 302 has a thickness 308 defined between the surfaces 304 and 306. A hole 310 defined by an inner wall 312 is defined through the thickness of the graphite planar element 302.

A thermal via 314 is received in hole 310. In this embodiment via 314 is a round disc as best seen in FIGS. 26 and 27, with chamfers 316 and 318 on its upper and lower ends 320 and 322. As is further described below, in this construction illustrated in FIG. 25 with the disc-shaped thermal via 314 embedded in the graphite planar element 302, the graphite material fits tightly against the disc-shaped via 314 and overlaps the chamfers 316 and 318 of the via 314. The via 314 has its upper and lower ends 320 and 322 flush with the second major surface 306 and first major surface 304, respectively, of graphite planar element 302. This construction enhances the heat transfer between and provides a mechanical bond between the via 314 and the graphite planar element 302.

The disc-shaped via 314 has a thickness substantially equal to the thickness 308 of the graphite planar element 302.

FIGS. 28, 29 and 30 are a sequential series of illustrations of the manner in which the disc-shaped thermal via 314 is embedded into the graphite planar element 302. Once again, the graphite planar element 302 has the hole 310 die cut therein. The dimensions of the die cut hole 310 are chosen so that given the tolerances involved the largest possible resulting hole is slightly smaller than the outside diameter of the disc-shaped via 314. During the embedding process, the via 314 will stretch and enlarge the hole 310.

FIG. 28 illustrates an exploded view of an embedding fixture 324 which includes upper and lower die halves 326 and 328 and a punch 330.

There is a through hole 332 in the upper die half 326 and a partial hole 334 in the lower die half 328.

The diameters of holes 332 and 334 are identical and are slightly larger than the outside diameter of the thermal via 314. Alignment guides (not shown) are used to line up the holes 332 and 334 in the upper and lower die parts 326 and 328 with the die cut hole 310 in the graphite planar element 302. A stop 336 is located in the lower die half 328. An upper end 338 of the stop 336 is flush with a top surface 340 of the lower die half 328, and the diameter of the stop is smaller than that of the disc-shaped via 314, so that an annular cavity 342 surrounds the stop 336. The punch 330 has the same outside diameter as the disc-shaped thermal via 314 and is used to press the via 314 into place.

Operation of the fixture 324 is best shown in FIG. 29. The graphite planar element 302 is aligned and clamped between the upper and lower die halves 326 and 328. Once clamped in place, a thin rim of graphite material (not shown) extends into the holes 332 and 334 in the die halves 326 and 328. The thermal via 314 is placed in the hole 332 in the upper die half 326, followed by the punch 330. Pressure is applied to the punch, forcing the via 314 downward through the protruding graphite material. Some of the protruding graphite material is cut off, while some of it is compressed around the via 314. The via 314 comes to rest against the end 338 of stop 336, flush with the lower surface 304 of graphite planar element 302. The cut scraps 344 of graphite material collect in the annular space 342 around the stop 336.

When the die halves 326 and 328 are moved apart and the graphite planar element 302 assembled with disc-shaped via 314 is removed from the fixture, the graphite material that was compressed by the via 314 forms peripheral bulges 346 and 348 adjacent the chamfered edges 316 and 318 of the disc-shaped via 314.

To flatten these bulges 346 and 348, the assembly 302, 314 is then placed between upper and lower platens of a press as shown in FIG. 30, and pressure is applied to the assembly 302, 314. This pressure should be larger than 1500 psi and less than 10,000 psi which is the minimum compressive strength of graphite material. The pressure compresses the bulges 346 and 348 flush with the end surfaces 320 and 322 of the disc-shaped via 314, and presses the graphite material against the chamfered edges 316 and 318 of the via 314 thus locking the via 314 tightly in place within the graphite planar element 302. The result is the heat spreader element 302, 314 illustrated in FIG. 25.

The chamfered edges 316 and 318 of disc-shaped via 314 may be generally described as recesses defined on the via 314. And as shown in FIG. 25, the graphite material of graphite planar element 302 overlaps the recesses or chamfered edges 316 and 318.

Referring now to FIGS. 31 and 32, this same process can also be used to make heat spreaders with thin surface layers 354 on them. The surface layer 354 will typically be formed from material such as Mylar, aluminum, copper or the like. In this case, the surface layer 354 is applied to the graphite planar element 302 prior to die cutting the hole 310 therein. Then the hole 310 is die cut into both the graphite planar element 302 and the surface layer 354. The hole diameter 310 and the outside diameter of via 314 must be chosen so that the hole through the surface layer completely encompasses a heat source such as 320 which is placed in contact with the via 314. The remaining steps of assembly resulting in an assembled product with surface layer 354 as illustrated in FIG. 32 are as described above with regard to FIGS. 28-30. This results in a heat spreader with embedded thermal via having both sides of the via exposed by holes in the surface layer 354 as illustrated in FIG. 32. This allows direct contact between the thermal via 314 and the heat source 320 while providing the surface layer 354 over all exposed areas of the graphite planar element 302.

The surface layer 354 in general can be described as being a surface layer thinner than the thickness 308 of graphite planar element 302 and covering the opposed major planar surfaces 304 and 306 of the graphite planar element 302.

Clad Spreader and Flush Thermal Via

Figure 33:
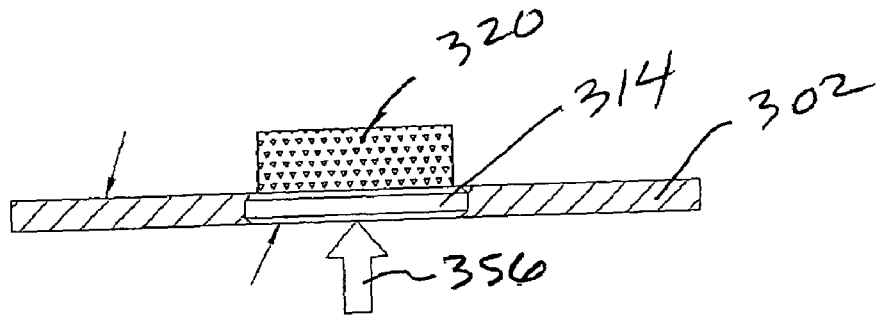
FIG. 33 is a view similar to FIG. 25 and illustrating the mounting modes which are present in one mode of usage of the heat spreader.

FIG. 33 is a view similar to FIG. 25. An arrow 356 represents a mounting load pressing the disc-shaped via 314 of the heat spreader against the heat source 320 in a manner such that no load is applied to the graphite planar element 302 itself The graphite planar element 302 remains flat, and there is good contact between the graphite planar element 302 and the thermal via 314 and heat transfer between the thermal 314 and the graphite planar element 302 is excellent.

Figure 34:
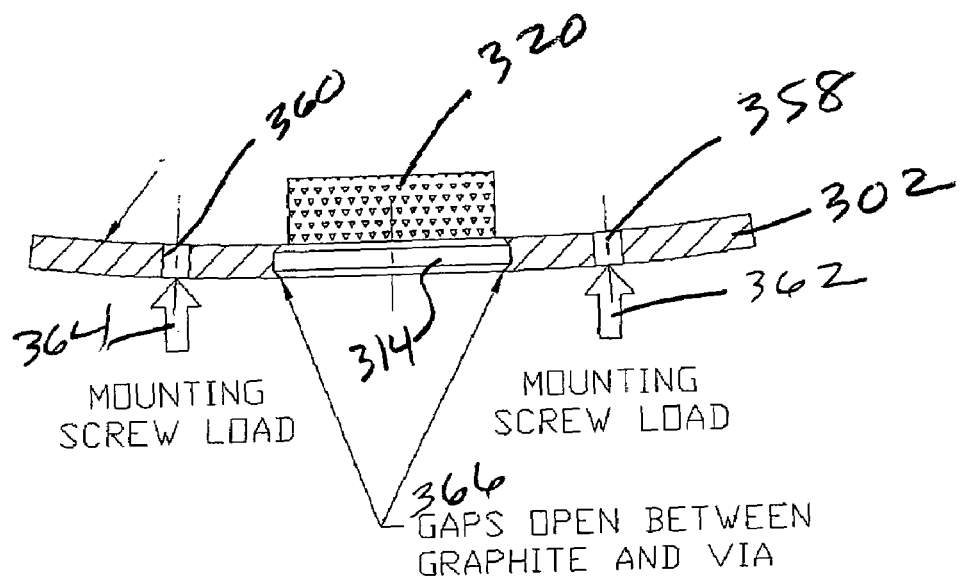
FIG. 34 is a view similar to FIG. 33 showing another mounting mode wherein two screws extend through the graphite planar element thus resulting in bending of the graphite heat spreader.

As illustrated in FIG. 34, it will however often be necessary to place mounting holes such as 358 and 360 through the graphite planar element 302 and place screws which apply mounting screw loads to the graphite planar element 302 adjacent holes 358 and 360 as represented by arrows 362 and 364. The mounting load is now applied directly to the graphite planar element 302. Because of the relatively low elastic modulus of the graphite planar element 302, a typical mounting load such as represented by arrows 362 and 364 may cause the graphite planar element 302 to bend as illustrated in FIG. 34 and portions of the graphite planar element 302 pull away from the thermal via 314 in the area designated by 366 thus causing gaps to open between the graphite planar element 302 and the thermal via 314. This results in a degradation of heat transfer between the via 314 and the graphite planar element 302 and a significant decrease in thermal performance of the heat spreader. Even modest mounting loads such as illustrated in FIG. 34 are sufficient to permanently bow the graphite planar element 302.

Figure 35:
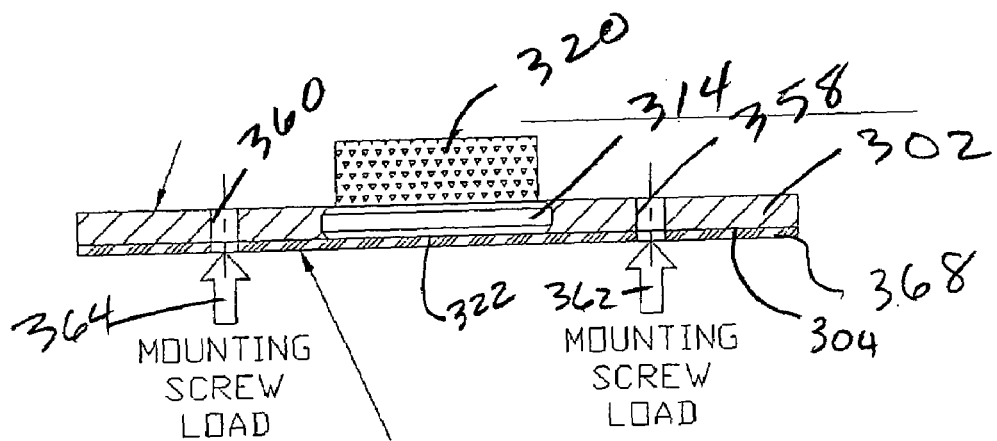
FIG. 35 is a view similar to FIG. 34 of a modified embodiment of the invention wherein a cladding layer has been added to the graphite heat spreader and the mounting holes extend through the cladding layer which provides structural integrity to the graphite heat spreader thus minimizing any bending thereof.

To overcome this problem, a thin layer of a continuous, relatively stiff material 368 can be clad to the lower side 304 of graphite planar element 302 as illustrated in FIG. 35. Cladding materials can include copper, aluminum, etc. and their alloys. For example, a sheet of aluminum with a minimum thickness of 0.003 inches is a typical choice for the cladding layer. The cladding layer 368 is adhered to the surface 304 of the graphite planar element 302 and to the lower end 322 of via 314 using an adhesive such as Ashland Aroset 3250. Once adhered, mounting screw holes 358 and 360 are punched or drilled through the cladding layer and the graphite planar material 302. Note that the cladding layer 368 is continuous over the lower end surface 322 of thermal via 314, and the only perforations through the cladding layer are for the mounting screw holes 358 and 360 through the graphite material 302. When the clad spreader is pressed against the heat source 302 as schematically illustrated in FIG. 3, the spreader remains flat, and there is no degradation in performance due to gaps forming between the thermal via 314 and the material of the graphite planar element 302.

Co-Forged Flush Thermal Via

FIGS. 36-39 comprise a sequential series of illustrations showing a further modification of the heat spreader with flush thermal via similar to that described above with regard to FIGS. 25-35.

In some very high performance applications, it will be important to completely minimize the thermal resistance between the disc-shaped via and the surrounding graphite material 302. This can be done by co-forging the via and the surrounding graphite material after the via has been inserted into the graphite planar element. Co-forging will result in plastic deformation of both the via and the graphite planar material and will cause the via material to join as tightly as possible to the surrounding graphite material and will reduce to a minimum the thermal resistance between these materials.

First, a graphite planar element 302 and disc-shaped thermal via 314 are assembled together as described above with reference to FIGS. 28-30. This results in the structure as illustrated in FIG. 36 having the annular bulges 346 and 348 of graphite material extending above and below the disc-shaped via 314.

Figure 36:
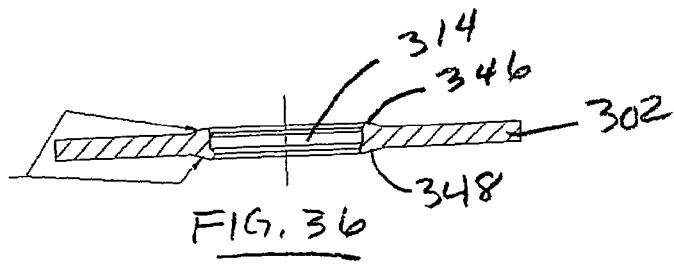
FIG. 36 is an elevation cross-sectioned view of a graphite planar element having a flush type via embedded therein as would result from the process illustrated in FIGS. 28 and 29.
Figure 37:
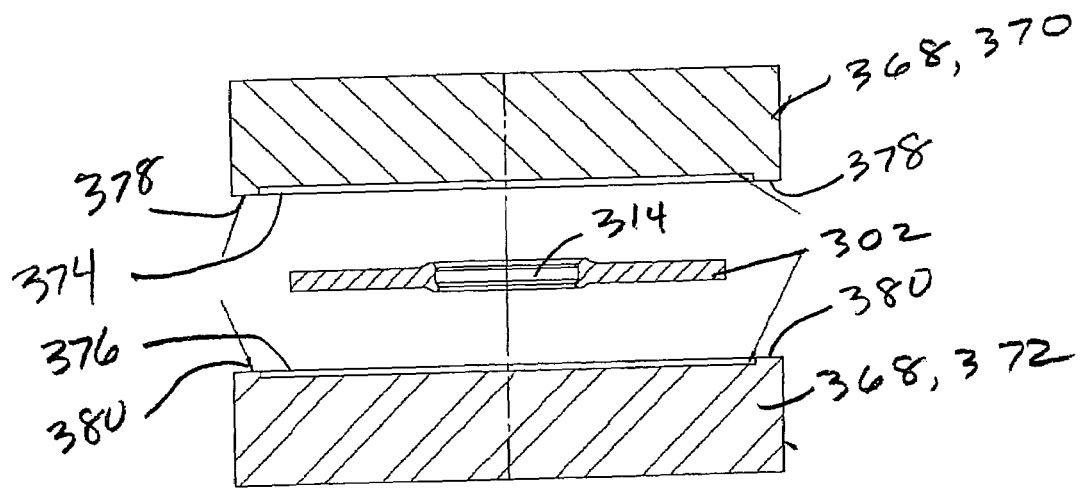
FIG. 37 is an exploded view of a die for co-forging the thermal via and graphite planar element. The two die halves are spread apart and the graphite heat spreader is shown in place therebetween.
Figure 38:
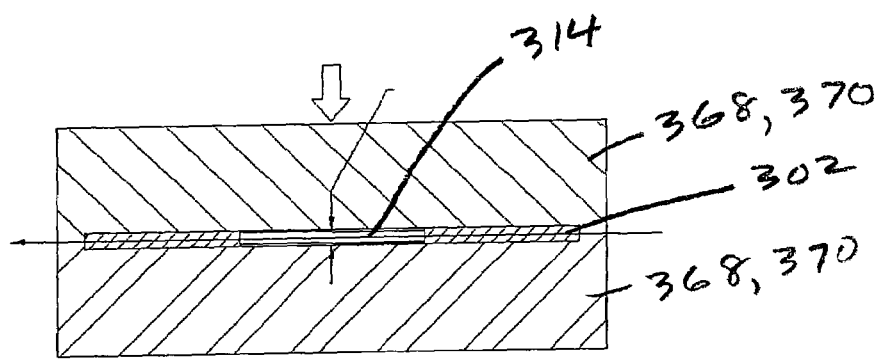
FIG. 38 is a further view of the die assembly of FIG. 37 showing the two die halves having been brought together to co-forge the thermal via and graphite planar element thus resulting in lateral spreading of the thermal via and graphite planar element.

To co-forge the graphite and the via materials, the assembly 302, 314 shown in FIG. 36 is placed in closed cavity forging die 368 made up of upper and lower die halves 370 and 372 illustrated in FIG. 37. Cavities 374 and 376 are machined into the die halves 370 and 372, respectively, and mating stop surfaces 378 and 380 form the edges of the cavities 374 and 376, respectively. The overall depth of the cavity formed by the two cavity portions 374 and 376 is less than the thickness of either the original graphite material 302 or the original disc-shaped thermal via 314. The size of the closed cavity is chosen so that when the via 314 and graphite planar element 302 are plastically deformed, the cavity will be large enough to allow these materials to flow and fill the cavity as illustrated in FIG. 38. The stop surfaces 378 and 380 control the amount of plastic deformation that is allowed. The stop surfaces 378 and 380 are sized so that once they contact each other, the forging load is transferred to the stop surfaces and no further plastic deformation of the via 314 or graphite planar material 302 occurs.

This co-forging of the via 314 and graphite planar element 302 is shown in FIG. 38. The minimum force that is applied to the forging die 368 must be sufficient to ensure simultaneous plastic deformation of both the graphite material of graphite planar element 302 and the material of the thermal via 314. This causes the via 314 and graphite to compress vertically and flow horizontally.

Figure 39:
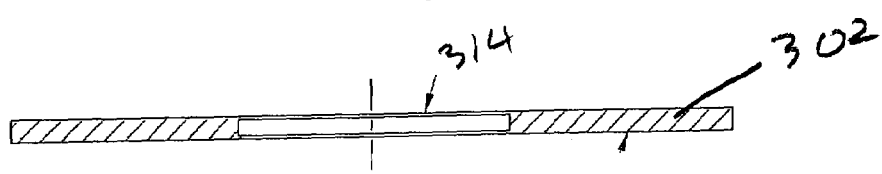
FIG. 39 is an elevation cross-sectioned view of the co-forged graphite planar element resulting from the process illustrated in FIGS. 37 and 38. As shown relative to FIG. 36, both the via and the graphite planar element have spread laterally due to the forging thereof.

The finished co-forged spreader is shown in FIG. 39. The plastic flow during co-forging results in intimate contact between the thermal via 314 and graphite planar element 302 and minimizes the thermal resistance between the two materials. After co-forging, surface layers can be applied to the finished spreader as described above with regard to FIGS. 31 and 32, and/or a cladding layer can be applied as described above with regard to FIG. 35.

All cited patents, patent applications and publications referred to in this application are incorporated by reference.

The above description is intended to enable the person skilled in the art to practice the invention. It is not intended to detail all of the possible variations and modifications that will become apparent to the skilled worker upon reading the description. It is intended, however, that all such modifications and variations be included within the scope of the invention that is defined by the following claims. The claims are intended to cover the indicated elements and steps in any arrangement or sequence that is effective to meet the objectives intended for the invention, unless the context specifically indicates the contrary.

What is claimed is:

1. A method of assembling a thermal management system, comprising:
    (a) forming a hole through a thickness of an anisotropic graphite planar element, the planar element having first and second oppositely facing major planar surfaces, the hole having a cross-sectional shape having maximum cross-sectional dimension parallel to the plane of the planar element;
    (b) providing a thermal via constructed of an isotropic material, the thermal via having a cross-sectional shape complementary to the cross-sectional shape of the hole and having a minimum cross-sectional dimension larger than the maximum cross-sectional dimension of the hole, wherein the thermal via includes a stem and a first flange, the stem comprising the minimum cross-sectional dimension; and
    (c) press fitting the thermal via into the hole of the graphite planar element until the first flange engages one of the major planar surfaces of the graphite planar element, thereby creating a close fit between the thermal via and graphite planar element, so that heat from a heat source can be conducted through the via into the thickness of the planar element.

2. The method of claim 1, wherein the graphite planar element is formed by compressing particles of exfoliated graphite.

3. The method of claim 1, wherein the via is constructed from a material selected from the group consisting of gold, silver, copper, aluminum and their alloys.

4. The method of claim 1, wherein:
    the cross-sectional shapes of the hole and the via are circular.

5. The method of claim 1, wherein:
    in step (a), the forming of the hole comprises die-cutting the hole.

6. The method of claim 1, further comprising:
    during step (c), the graphite mushrooms up around the stem creating a mushroomed protrusion; and
    forcing down the mushroomed protrusion flush with the other of the major planar surfaces of the graphite planar element opposite from the flange of the via.

7. The method of claim 1, further comprising:
    tightly fitting a second flange on a free end of the stem opposite from the first flange, and compressing the graphite planar element between the first and second flanges.

8. The method of claim 1, further comprising:
    pressing a press-on nut onto a free end of the stem opposite from the first flange, so that the press-on nut engages the graphite planar element to hold the via firmly in place in the hole of the graphite planar element.

9. A method of assembling a thermal management system, comprising:
    (a) forming a hole through a thickness of an anisotropic graphite planar element, the planar element having first and second oppositely facing major planar surfaces, the hole having a cross-sectional shape having maximum cross-sectional dimension parallel to the plane of the planar element;
    (b) providing a thermal via constructed of an isotropic material, the thermal via is in the shape of a cylindrical disc having chamfered edges having a thickness substantially equal to the thickness of the graphite planar element and a cross-sectional shape complementary to the cross-sectional shape of the hole and having a minimum cross-sectional dimension larger than the maximum cross-sectional dimension of the hole;

(c) press fitting the thermal via into the hole of the graphite planar element such that the graphite planar element bulges adjacent the chamfered edges of the via forming peripheral bulges, thereby creating a close fit between the thermal via and graphite planar element, so that heat from a heat source can be conducted through the via into the thickness of the planar element; and (d) compressing the peripheral bulges so that the via is flush with both of the major planar surfaces of the graphite planar element.

10. The method of claim 6, further comprising:
during said compressing step, co-forging both the via and the graphite planar element thereby creating simultaneous plastic deformation of both the via and the graphite planar element.

11. The method of claim 6, further comprising:
after said compressing step, cladding one of the major planar surfaces and covering the via with the cladding.

12. A thermal management system, comprising:
an anisotropic graphite planar element having first and second opposed major planar surfaces; and
a thermal via, constructed of an isotropic material, the via being embedded in the graphite planar element and having first and second exposed ends flush with the first and second opposed major planar surfaces, respectively, of the graphite planar element, the via having a recess defined thereon and the graphite planar element overlapping the recess.

13. The system of claim 12, wherein the anisotropic graphite planar element comprises compressed particles of exfoliated graphite.

14. The system of claim 12, wherein the via is constructed from a material selected from the group consisting of gold, silver, copper, aluminum and their alloys.

15. The system of claim 12, wherein:
the recess comprises a peripheral chamfer on each of the first and second ends of the via.

16. The system of claim 12, wherein the overlapping of the graphite planar element and the recess of the via enhances heat transfer between the graphite planar element and the via.

17. The system of claim 12, wherein the overlapping of the graphite planar element and the recess of the via provides a mechanical bond between the via and the graphite.

18. The system of claim 12, wherein the via is cylindrical in shape.

19. The system of claim 12, further comprising:
a surface layer thinner than a thickness of the graphite planar element and covering the opposed major planar surfaces of the graphite planar element, the first and second exposed ends of the via being flush with the surface layer.

20. The system of claim 12, further comprising:
a cladding layer adhered to the first major planar surface and covering the first end of thermal via.

21. The system of claim 20, further comprising a mounting screw hole extending through the cladding layer and the graphite planar element.

22. A thermal management system, comprising:
an anisotropic graphite planar element having first and second oppositely facing major planar surfaces and having a thickness defined between the planar surfaces, the planar element having a relatively high thermal conductivity parallel to the planar surfaces and having a relatively low thermal conductivity across the thickness, the planar element having a cavity defined therethrough between the planar surfaces, the cavity being defined by an inner cavity wall;
a thermal via having:
a stem extending through the cavity and closely engaging the inner cavity wall;
a flange extending laterally from the stem and closely engaging one of the planar surfaces of the planar element; and
the via being constructed of an isotropic material so that heat from a heat source can be conducted through the via into the thickness of the planar element; and
a push-on nut, received over and frictionally engaging the stem of the thermal via, the nut snugly engaging the other of the planar surfaces of the planar element other than the one of the planar surfaces engaged by the flange, so that the planar element is sandwiched between the flange and the nut.

23. The system of claim 22, wherein the anisotropic graphite planar element comprises compressed particles of exfoliated graphite.

24. The system of claim 22, wherein the via is constructed from a material selected from the group consisting of gold, silver, copper, aluminum, and their alloys.

25. The system of claim 22, wherein the nut is made from a different material than the via.

26. The system of claim 22, further comprising:
a heat source having a heat conducting contact area defined thereon in contact with an end of the stem opposite from the flange, the contact area being less than an area of the end of the stem.

27. The system of claim 22, wherein the stem has a free end opposite from the flange, the free end extending entirely through and past the push-on nut.

28. The system of claim 22, further comprising:
a washer loosely received about the stem and clamped between the push-on nut and the graphite planar element.

29. The system of claim 22, further comprising:
a second flange attached to the stem adjacent an end of the stem opposite from the first flange, the second flange having an inner bore closely received about the stem; and
the graphite planar element having an annular portion surrounding the cavity compressed between the first and second flanges so that both the first and second flanges are in intimate heat conducting engagement with the graphite planar element.

30. The system of claim 29, wherein the second flange is press fit upon the stem.

31. The system of claim 29, wherein:
the stem has a stem shoulder defined thereon and facing away from the first flange; and
the inner bore of the second flange has a flange shoulder defined thereon complementary to and abutting the stem shoulder of the stem.

32. The system of claim 29, wherein:
the stem has a straight cylindrical outer surface of constant diameter and the inner bore of the second flange is a straight cylindrical inner bore; and
the second flange is flush with the end of the stem opposite from the first flange.

33. A method of assembling a thermal management system, comprising:
  (a) forming a hole through a thickness of an anisotropic graphite planar element, the planar element having first and second oppositely facing major planar surfaces, the hole having a cross-sectional shape having maximum cross-sectional dimension parallel to the plane of the planar element;
  (b) providing a thermal via constructed of an isotropic material, the thermal via having a thickness substantially equal to the thickness of the graphite planar element and a cross-sectional shape complementary to the cross-sectional shape of the hole and having a minimum cross-sectional dimension larger than the maximum cross-sectional dimension of the hole; and
  (c) press fitting the thermal via into the hole of the graphite planar element, thereby creating a close fit between the thermal via and graphite planar element, so that heat from a heat source can be conducted through the via into the thickness of the planar element; and
  (d) cladding one of the major planar surfaces of the planar element and covering the via with the cladding.

* * * * *

UNITED STATES PATENT AND TRADEMARK OFFICE
CERTIFICATE OF CORRECTION

| | | |
|---|---|---|
| PATENT NO. | : 7,303,005 B2 | Page 1 of 1 |
| APPLICATION NO. | : 11/339338 | |
| DATED | : December 4, 2007 | |
| INVENTOR(S) | : Bradley E. Reis et al. | |

It is certified that error appears in the above-identified patent and that said Letters Patent is hereby corrected as shown below:

At col. 29, Claim 10, Line 16, please replace "claim 6" with "claim 9"

and

At col. 29, Claim 11, Line 21, please replace "claim 6" with "claim 9"

Signed and Sealed this
Third Day of April, 2012

David J. Kappos
*Director of the United States Patent and Trademark Office*